US012713988B2

(12) United States Patent
Ji et al.

(10) Patent No.: US 12,713,988 B2
(45) Date of Patent: Aug. 18, 2026

(54) SEMICONDUCTOR PACKAGE AND METHOD OF FABRICATING THE SAME

(71) Applicant: Samsung Electronics Co., Ltd., Suwon-si (KR)

(72) Inventors: Min Seung Ji, Suwon-si (KR); Ha Seob Seong, Suwon-si (KR); Ae-Nee Jang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 348 days.

(21) Appl. No.: 18/471,678

(22) Filed: Sep. 21, 2023

(65) Prior Publication Data

US 2024/0170458 A1 May 23, 2024

(30) Foreign Application Priority Data

Nov. 21, 2022 (KR) ........................ 10-2022-0156338

(51) Int. Cl.
*H10W 90/00* (2026.01)
*H10W 20/00* (2026.01)
(Continued)

(52) U.S. Cl.
CPC ......... *H10W 90/00* (2026.01); *H10W 20/023* (2026.01); *H10W 20/20* (2026.01);
(Continued)

(58) Field of Classification Search
CPC ... H10W 90/00; H10W 20/023; H10W 20/20; H10W 70/685; H10W 74/016; H10W 74/11; H10W 74/15; H10W 90/297; H10W 90/724; H10W 90/732; H10W 20/2134; H10W 70/611; H10W 72/944; H10W 74/014; H10W 74/019; H10W 74/137; H10W 74/147; H10W 74/43;
(Continued)

(56) References Cited

U.S. PATENT DOCUMENTS

| | | | |
|---|---|---|---|
| 9,349,670 | B2 | 5/2016 | Zhou et al. |
| 9,978,694 | B2 | 5/2018 | Cho et al. |

(Continued)

FOREIGN PATENT DOCUMENTS

| | | | |
|---|---|---|---|
| JP | 2004-289002 | A | 10/2004 |
| KR | 10-1013554 | B1 | 2/2011 |
| KR | 10-2060742 | B1 | 12/2019 |

*Primary Examiner* — Yasser A Abdelaziez
(74) *Attorney, Agent, or Firm* — Wolf, Greenfield & Sacks, P.C.

(57) ABSTRACT

A semiconductor package and a method of fabricating the same are provided. The semiconductor package includes a first semiconductor chip; a chip stack including a plurality of second semiconductor chips, which are stacked on the first semiconductor chip; a first molding layer in contact with an upper surface of the first semiconductor chip and side surfaces of the chip stack and exposing an upper surface of the chip stack; a bonding layer in contact with an upper surface of the first molding layer and the upper surface of the chip stack; a dummy semiconductor chip on the bonding layer; and a second molding layer on at least part of the dummy semiconductor chip and on the bonding layer, wherein the upper surface of the chip stack has a wavy shape, and an upper surface of the bonding layer is flat.

20 Claims, 18 Drawing Sheets

(51) Int. Cl.

| | |
|---|---|
| ***H10W 20/20*** | (2026.01) |
| ***H10W 70/685*** | (2026.01) |
| ***H10W 74/01*** | (2026.01) |
| ***H10W 74/10*** | (2026.01) |
| *H10W 74/15* | (2026.01) |
| *H10W 90/20* | (2026.01) |

(52) U.S. Cl.

CPC ....... *H10W 70/685* (2026.01); *H10W 74/016* (2026.01); *H10W 74/114* (2026.01); *H10W 74/15* (2026.01); *H10W 90/297* (2026.01); *H10W 90/724* (2026.01); *H10W 90/732* (2026.01)

(58) Field of Classification Search

CPC ... H10W 90/20; H10W 90/26; H10W 90/291; H10W 72/0198; H10W 72/30; H10W 72/851; H10W 90/401; H10W 90/701; H10W 90/792; H10W 72/90; H10W 99/00; H10W 70/614; H10W 70/65; H10W 74/111; H10W 72/01; H10W 72/20; H10W 80/312; H10W 80/327; H10W 80/754; H10W 74/141

See application file for complete search history.

(56) References Cited

U.S. PATENT DOCUMENTS

| | | | | |
|---|---|---|---|---|
| 10,770,445 | B2 | 9/2020 | Han | |
| 10,872,836 | B2 | 12/2020 | Yu et al. | |
| 11,145,626 | B2 | 10/2021 | Hwang et al. | |
| 11,233,035 | B2 | 1/2022 | Chen et al. | |
| 2016/0056101 | A1* | 2/2016 | Jee | H10W 74/01<br>257/737 |
| 2018/0138101 | A1* | 5/2018 | Yu | H10W 70/095 |
| 2019/0371763 | A1* | 12/2019 | Agarwal | H10W 90/00 |
| 2021/0343616 | A1* | 11/2021 | Choi | H10W 40/22 |
| 2021/0358875 | A1* | 11/2021 | Lee | H10W 74/117 |
| 2022/0013503 | A1* | 1/2022 | Jung | H10W 90/00 |
| 2022/0028834 | A1 | 1/2022 | Lee et al. | |
| 2022/0359341 | A1* | 11/2022 | Kim | H10W 40/28 |
| 2023/0018676 | A1* | 1/2023 | Ko | H10W 90/00 |

* cited by examiner 600
500
400
300
460
260
200
208
207
206
205
204
203
202
201
100
565
160
610
642
620
630
644
665
660
842
800
830
812
860
742
700
712
760

SEMICONDUCTOR PACKAGE AND METHOD OF FABRICATING THE SAME

CROSS-REFERENCE TO RELATED APPLICATION

This application claims priority from Korean Patent Application No. 10-2022-0156338 filed on Nov. 21, 2022, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor package and a method of fabricating the same.

2. Description of the Related Art

A die-to-wafer bonding process for fabricating a multi-chip package in which a plurality of semiconductor chips are stacked may use a hybrid bonding method that directly bonds pads to pads and insulating films to insulating films without using solder bumps. In the case of bonding an uppermost die to a die below the uppermost die, the uppermost die may not be able to be properly bonded, or voids may be generated if the upper surface of the die below the uppermost die is rugged or has an irregular surface.

SUMMARY

Aspects of the present disclosure provide a semiconductor package with an improved product reliability.

Aspects of the present disclosure also provide a method of fabricating a semiconductor package with an improved product reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor package including a first semiconductor chip including a first semiconductor substrate having first and second surfaces, that are opposite to each other, a first bonding layer on the first surface of the first semiconductor substrate, a second bonding layer on the second surface of the first semiconductor substrate, and first through vias in the first semiconductor substrate; connection terminals on the first bonding layer; a chip stack including a plurality of second semiconductor chips, on the first semiconductor chip, each of the second semiconductor chips including a second semiconductor substrate having third and fourth surfaces, that are opposite to each other, where the third surface facing the second surface of the first semiconductor substrate, a third bonding layer on the third surface of the second semiconductor substrate, a fourth bonding layer on the fourth surface of the second semiconductor substrate, and second through vias in the second semiconductor substrate; a first molding layer on the first semiconductor chip, the first molding layer surrounding the chip stack in a plan view and exposing an upper surface of the chip stack; a fifth bonding layer on the first molding layer and on the upper surface of the chip stack, exposed by the first molding layer; a dummy semiconductor chip on the fifth bonding layer, the dummy semiconductor chip including a dummy semiconductor substrate and a sixth bonding layer on the dummy semiconductor substrate; and a second molding layer on the fifth bonding layer, the second molding layer surrounding the dummy semiconductor chip in a plan view, wherein each pair of adjacent ones of the second and the third bonding layers are bonded together, each pair of adjacent ones of the third and the fourth bonding layers are bonded together, the fifth bonding layer is bonded to the one of the fourth bonding layers that is adjacent to the fifth bonding layer, the fifth and the sixth bonding layers are bonded together, a lower surface of the fifth bonding layer has a wavy shape, and an upper surface of the fifth bonding layer is flat.

According to the aforementioned and other embodiments of the present disclosure, there is provided a semiconductor package including a first semiconductor chip including a first bonding layer; a chip stack electrically connected to the first semiconductor chip and including a plurality of second semiconductor chips, which are stacked, on the first semiconductor chip, each of the second semiconductor chips including second and third bonding layers, which are opposite to each other; a first molding layer surrounding entire side surfaces of the chip stack in a plan view, on the first semiconductor chip; a fourth bonding layer extending along an upper surface of the first molding layer and an upper surface of the chip stack; a dummy semiconductor chip including a fifth bonding layer, on the fourth bonding layer, and not electrically connected to the chip stack; and a second molding layer surrounding at least part of the dummy semiconductor chip in a plan view, on the fourth bonding layer, wherein the first bonding layer and one of the second bonding layers that is adjacent to the first bonding layer are bonded together, each pair of adjacent ones of the second and the third bonding layers are bonded together, and the fifth bonding layer and one of the third bonding layers that is adjacent to the fifth bonding layer are bonded together, and the fourth and the fifth bonding layer are bonded together.

According to the aforementioned and other embodiments of the present disclosure, there is provided a semiconductor package including a first semiconductor chip; a chip stack including a plurality of second semiconductor chips, which are stacked, on the first semiconductor chip; a first molding layer in contact with an upper surface of the first semiconductor chip and side surfaces of the chip stack and exposing an upper surface of the chip stack; a bonding layer in contact with an upper surface of the first molding layer and the upper surface of the chip stack; a dummy semiconductor chip on the bonding layer; and a second molding layer on at least part of the dummy semiconductor chip and on the bonding layer, wherein the upper surface of the chip stack has a wavy shape, and an upper surface of the bonding layer is flat.

According to the aforementioned and other embodiments of the present disclosure, there is provided a method of fabricating a semiconductor package including forming a chip stack in which a plurality of second semiconductor chips are stacked; bonding the chip stack on a first semiconductor chip; forming a first molding layer, which surrounds side surfaces of the chip stack in a plan view and exposes an upper surface of the chip stack, on the first semiconductor chip; forming a first bonding layer, which extends along an upper surface of the first molding layer and the upper surface of the chip stack; and bonding a dummy semiconductor chip on the first bonding layer.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which:

FIGS. 11 through 18 are cross-sectional views illustrating a method of fabricating a semiconductor package according to some embodiments of the present disclosure.

DETAILED DESCRIPTION

Figure 1:
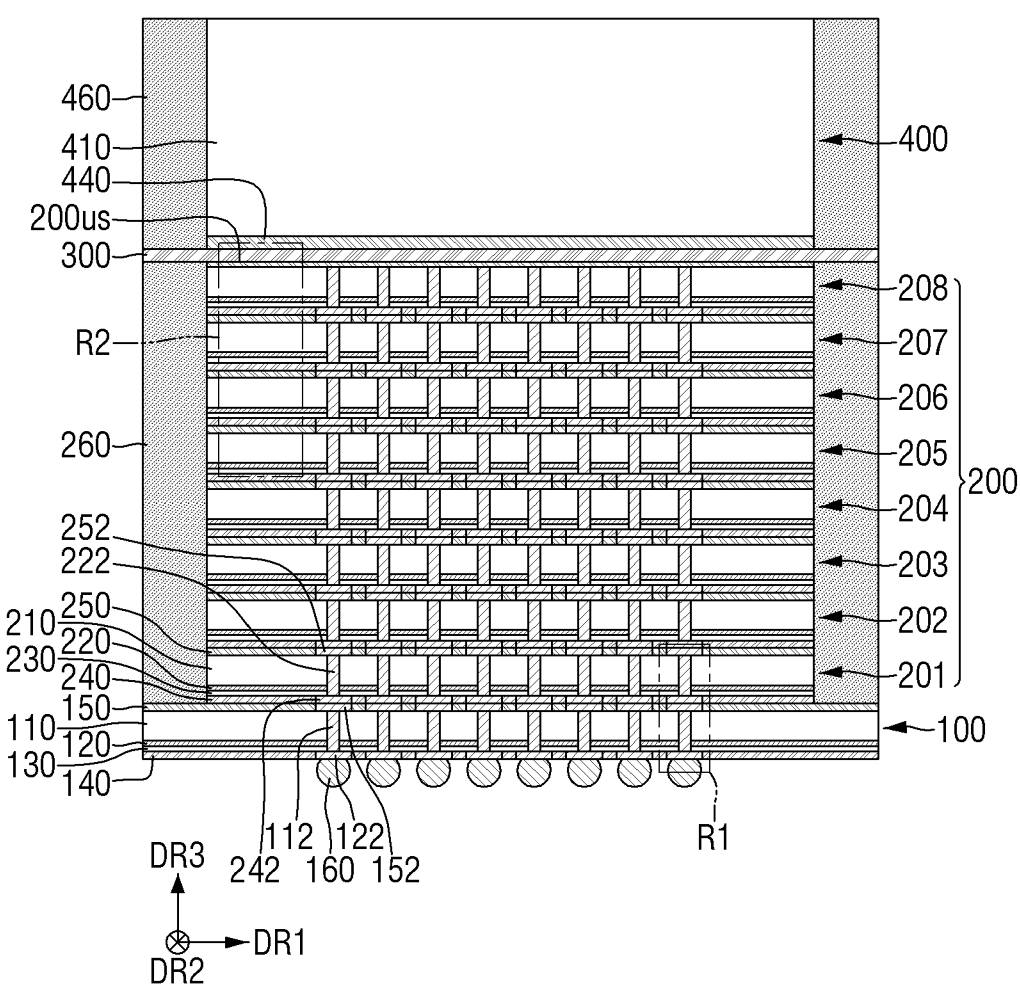
FIG. 1 is a cross-sectional view of a semiconductor package according to some embodiments of the present disclosure.
Figure 2:
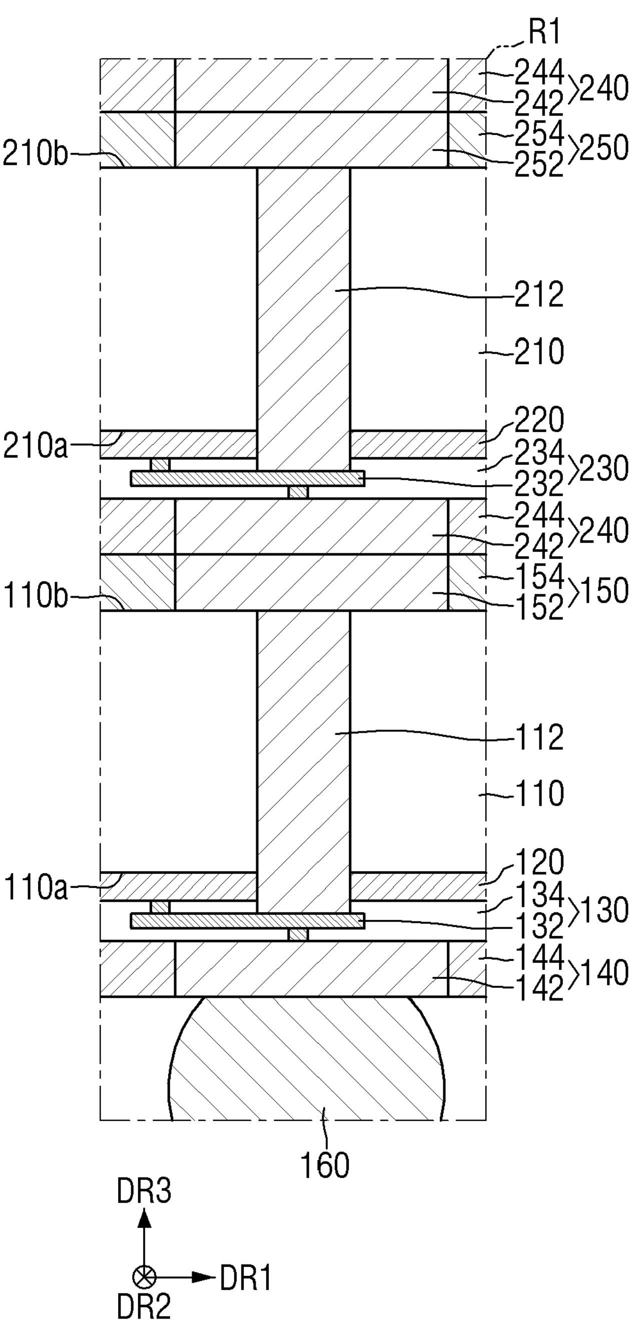
FIG. 2 is an enlarged cross-sectional view of an area R1 of FIG. 1.
Figure 3:
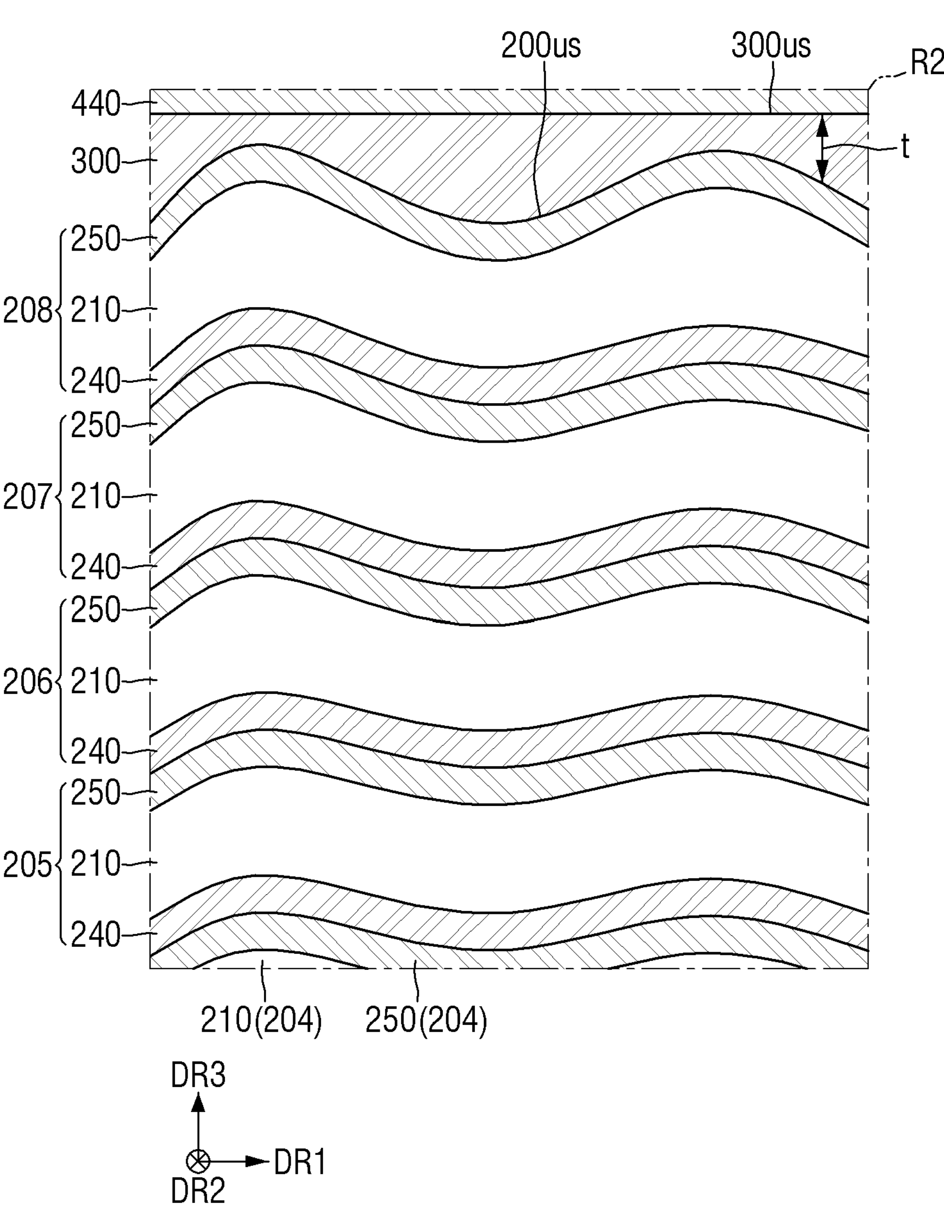
FIG. 3 is an enlarged cross-sectional view of an area R2 of FIG. 1.

Hereinafter, embodiments will be described in detail with reference to the accompanying drawings. In this description, like reference numerals may indicate like components. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. The following will now describe a semiconductor package and its fabrication method according to the present inventive concepts. FIG. 1 is a cross-sectional view of a semiconductor package according to some embodiments of the present disclosure. FIG. 2 is an enlarged cross-sectional view of an area R1 of FIG. 1. FIG. 3 is an enlarged cross-sectional view of an area R2 of FIG. 1. For convenience of illustration, a second semiconductor element layer 220, a second chip wiring layer 230, a third bonding layer 240, a fourth bonding layer 250, third bonding pads 242, and fourth bonding pads 252 of each of a plurality of second semiconductor chips 201 through 208 are not illustrated in FIG. 3.

Referring to FIGS. 1 and 2, the semiconductor package may include a first semiconductor chip 100, first connection terminals 160, a chip stack 200, a first molding layer 260, a fifth bonding layer 300, a dummy semiconductor chip 400, and a second molding layer 460.

The first semiconductor chip 100 may include a first semiconductor substrate 110, a first semiconductor element layer 120, a first chip wiring layer 130, a first bonding layer 140, a second bonding layer 150, and first through vias 112.

The first semiconductor substrate 110 may have first and second surfaces 110*a* and 110*b*, which are opposite to each other. The first surface 110*a* may be the upper surface, in a third direction DR3, of the first semiconductor substrate 110, and the second surface 110*b* may be the lower surface, in the third direction DR3, of the first semiconductor substrate 110. The first surface 110*a* of the first semiconductor substrate 110 may be an active surface where the first semiconductor element layer 120 is formed.

The third direction DR3 may be considered a vertical direction and may intersect first and second directions DR1 and DR2, which may be considered horizontal or lateral directions. The first and second directions DR1 and DR2 may be directions parallel to the first or second surface 110*a* or 110*b* of the first semiconductor substrate 110, and the third direction DR3 may be a direction perpendicular to the first surface 110*a* of the first semiconductor substrate 110. The terms "uppermost surface." "upper surface." "upper part." "lowermost surface." "lower surface." and "lower part." as used herein, may be defined based on the third direction DR3.

The first semiconductor element layer 120 may be disposed on the first surface 110*a* of the first semiconductor substrate 110.

The first chip wiring layer 130 may be disposed on the first semiconductor element layer 120. The first chip wiring layer 130 may be electrically connected to the first semiconductor element layer 120. The first chip wiring layer 130 may include a first inter-chip wiring insulating film 134 and first chip wiring structures 132 in the first inter-chip wiring insulating film 134. The first chip wiring structures 132 may include multilayer wiring patterns and vias connecting the multilayer wiring patterns. For example, the first semiconductor element layer 120 may be in contact with uppermost wiring patterns of the first chip wiring structure 132. The layout and the number of first chip wiring structures 132 and the number of layers of each of the first chip wiring structures 132 are merely examples and not limiting.

The first bonding layer 140 may be disposed on the first chip wiring layer 130. The first bonding layer 140 may be electrically connected to the first chip wiring layer 130. The first bonding layer 140 may be electrically connected to the first semiconductor element layer 120. The first bonding layer 140 may include a first bonding insulating film 144 and first bonding pads 142 in the first bonding insulating film 144. The first bonding pads 142 may be in contact with, for example, lowermost wiring patterns of the first chip wiring structures 132.

The first through vias 112 may be disposed in the first semiconductor substrate 110. The first through vias 112 may be electrically connected to the first bonding layer 140 through the first semiconductor substrate 110 and the first semiconductor element layer 120. For example, the first through vias 112 may be in contact with the second bonding pads 152 and the uppermost wiring patterns of the first chip wiring structures 132.

The second bonding layer 150 may be disposed on the second surface 110*b* of the first semiconductor substrate 110. The second bonding layer 150 may be electrically connected to the first through vias 112. The second bonding layer 150 may include a second bonding insulating film 154 and second bonding pads 152 in the second bonding insulating film 154. The second bonding pads 152 may be in contact with, for example, the first through vias 112.

The first connection terminals 160 may be disposed on the first semiconductor chip 100. The first connection terminals 160 may be disposed on the first bonding layer 140. The first connection terminals 160 may be disposed on the first bonding pads 142. The first connection terminals 160 may be in contact with the first bonding pads 142. The first connection terminals 160 may be electrically connected to the first bonding pads 142.

The first connection terminals 160 may include, for example, solder balls, bumps, or under-bump metallurgy (UBM). The first connection terminals 160 may include a metal such as tin (Sn), but embodiments of the present disclosure are not limited thereto.

The chip stack 200 may be disposed on the first semiconductor chip 100. The chip stack 200 may include the second semiconductor chips 201 through 208. The second semiconductor chips 201 through 208 may be stacked in the third direction DR3. The number of second semiconductor chips 201 through 208 is merely an example and not limiting.

For example, each of the second semiconductor chips 201 through 208 may include a second semiconductor substrate 210, a second semiconductor element layer 220, a second chip wiring layer 230, a third bonding layer 240, and a fourth bonding layer 250. For example, each of the second semiconductor chips 201 through 207 may further include second through vias 212. That is, the second semiconductor chip 208, which is at the top of the chip stack 200, may not include the second through vias 212.

The second semiconductor substrate 210 may have third and fourth surfaces 210*a* and 210*b*, which are opposite to each other. The fourth surface 210*b* of may face the second surface 110*b* of the first semiconductor substrate 110. The third surface 210*a* may be the upper surface of the second semiconductor substrate 210, and the fourth surface 210*b* may be the lower surface of the second semiconductor substrate 210.

The second semiconductor element layer 220 may be disposed on the third surface 210*a* of the second semiconductor substrate 210.

The first and second semiconductor element layers 120 and 220 may include various microelectronic elements such as, for example, metal-oxide semiconductor field-effect transistors (e.g., complementary metal-oxide semiconductor (CMOS) transistors), system large-scale integration (LSI), flash memories, dynamic random-access memories (DRAMs), static random-access memories (SRAMs), electrically erasable programmable read-only memories (EEPROMs), phase-change random-access memories (PRAMs), magnetoresistive random-access memories (MRAMs), or resistive random-access memories (ReRAMs), imaging sensors (e.g., CMOS imaging sensors (CISs)), micro-electro mechanical systems (MEMSs), active elements, and/or passive elements.

The second chip wiring layer 230 may be disposed on the second semiconductor element layer 220. The second chip wiring layer 230 may be electrically connected to the second semiconductor element layer 220. The second chip wiring layer 230 may include a second inter-chip wiring insulating film 234 and second chip wiring structures 232 in the second inter-chip wiring insulating film 234. The second chip wiring structures 232 may include multilayer wiring patterns and vias connecting the multilayer wiring patterns. For example, the second semiconductor element layer 220 may be in contact with uppermost wiring patterns of the second chip wiring structure 232. The layout and the number of second chip wiring structures 232 and the number of layers of each of the second chip wiring structures 232 are merely examples and not limiting.

The first chip wiring structures 132 and the second chip wiring structures 232 may include, for example, tungsten (W), aluminum (Al), and/or copper (Cu), but embodiments of the present disclosure are not limited thereto.

The third bonding layer 240 may be disposed on the second chip wiring layer 230. The third bonding layer 240 may be electrically connected to the second chip wiring layer 230. The third bonding layer 240 may be electrically connected to the second semiconductor element layer 220. The third bonding layer 240 may include a third bonding insulating film 244 and third bonding pads 242 in the third bonding insulating film 244. The third bonding pads 242 may be in contact with, for example, lowermost wiring patterns of the second chip wiring structures 232.

The second through vias 212 may be disposed in the second semiconductor substrate 210. The second through vias 212 may be electrically connected to the third bonding layer 240 through the second semiconductor substrate 210 and the second semiconductor element layer 220. For example, the second through vias 212 may be in contact with, for example, fourth bonding pads 252 and the uppermost wiring patterns of the second chip wiring structures 232.

The first through vias 112 and the second through vias 212 may include, for example, Cu, a Cu alloy (such as CuSn, CuMg, CuNi, CuZn, CuPd, CuAu, CuRe, or CuW), W, a W alloy, nickel (Ni), ruthenium (Ru), and/or cobalt (Co), but embodiments of the present disclosure are not limited thereto.

The fourth bonding layer 250 may be disposed on the second chip wiring layer 230. The fourth bonding layers 250 of the second semiconductor chips 201 through 207 may be electrically connected to their respective second chip wiring layers 230. Each of the fourth bonding layers 250 of the second semiconductor chips 201 through 207 may include a fourth bonding insulating film 254 and fourth bonding pads 252 in the fourth bonding insulating film 254. The fourth bonding pads 252 may be in contact with, for example, the second through vias 212. The fourth bonding layer 250 of the second semiconductor chip 208, which is at the top of the chip stack 200, may include a fourth bonding insulating film 254. That is, the fourth bonding layer 250 of the second semiconductor chip 208 may not include pads.

The first bonding pads 142 of the first semiconductor chip 100 and the second bonding pads 152, the third bonding pads 242, and the fourth bonding pads 252 of each of the second semiconductor chips 201 through 208 may include one or more materials, such as, for example, Cu, W, Al, tungsten nitride (WN), tantalum nitride (TaN), and/or titanium nitride (TiN), but embodiments of the present disclosure are not limited thereto. The first bonding insulating film 144 of the first semiconductor chip 100 and the second, third, and fourth bonding insulating films 154, 244, and 254 of each of the second semiconductor chips 201 through 208 may include one or more insulating materials, such as, for example, SiO, SiN, SiCN, SiOC, SiON, and/or SiOCN, but embodiments of the present disclosure are not limited thereto.

The chip stack 200 and the first semiconductor chip 100 may be bonded together. The third bonding layer 240 of the second semiconductor chip 201, which is at the bottom of the chip stack 200, may be in contact with the second bonding layer 150 of the first semiconductor chip 100. The third bonding layer 240 of the second semiconductor chip 201 and the second bonding layer 150 of the first semiconductor chip 100 may be directly bonded together. The third bonding layer 240 of the second semiconductor chip 201 and the second bonding layer 150 of the first semiconductor chip 100 may be bonded by a hybrid bonding method, for example, e metal-to-dielectric bonding method. For example, the third bonding pads 242 of the second semiconductor chip 201 may be directly bonded to the second bonding pads 152 of the first semiconductor chip 100, and the third bonding insulating film 244 of the second semiconductor chip 201 may be directly bonded to the second bonding insulating film 154 of the first semiconductor chip 100. The first and second semiconductor chips 100 and 201 may be electrically connected by the second bonding pads 152 of the first semiconductor chip 100 and the third bonding pads 242 of the second semiconductor chip 201.

The third bonding pads 242 of the second semiconductor chip 201 and the second bonding pads 152 of the first semiconductor chip 100 may be bonded by a metal-to-metal bonding method. For example, the third bonding pads 242 of the second semiconductor chip 201 and the second bonding pads 152 of the first semiconductor chip 100 may include Cu and may be bonded in a Cu—Cu bonding method.

The third bonding insulating film 244 of the second semiconductor chip 201 and the second bonding insulating film 154 of the first semiconductor chip 100 may be bonded by a dielectric-to-dielectric bonding method. The third bonding insulating film 244 of the second semiconductor chip 201 and the second bonding insulating film 154 of the first semiconductor chip 100 may include the same material. In other embodiments, the third bonding insulating film 244 of the second semiconductor chip 201 and the second bonding insulating film 154 of the first semiconductor chip 100 may include different materials. The third bonding insulating film 244 of the second semiconductor chip 201 and the second bonding insulating film 154 of the first semiconductor chip 100 may include, for example, silicon oxide and/or silicon oxynitride.

The second semiconductor chips 201 through 208 of the chip stack 200 may be bonded to one another. Third and fourth bonding layers 240 and 250 of every two adjacent second semiconductor chips of the chip stack 200 may be in contact with each other and may be directly bonded together. The second semiconductor chips 201 through 208 may be bonded to one another by the hybrid bonding method. For example, third bonding pads 242 and fourth bonding pads 252 of every two adjacent second semiconductor chips of the chip stack 200 may be directly bonded together, and third and fourth bonding insulating films 244 and 254 of every two adjacent second semiconductor chips of the chip stack 200 may be directly bonded together. Every two adjacent second semiconductor chips of the chip stack 200 may be electrically connected by the third bonding pads 242 and the fourth bonding pads 252.

The third bonding pads 242 and the fourth bonding pads 252 of every two adjacent second semiconductor chips of the chip stack 200 may be bonded by the metal-to-metal bonding method, and the third and fourth bonding insulating films 244 and 254 of every two adjacent second semiconductor chips of the chip stack 200 may be bonded by the dielectric-to-dielectric bonding method. For example, the third bonding pads 242 and the fourth bonding pads 252 of every two adjacent second semiconductor chips of the chip stack 200 may include Cu and may be bonded by the Cu—Cu bonding method. The third and fourth bonding insulating films 244 and 254 of every two adjacent second semiconductor chips of the chip stack 200 may include the same material. In other embodiments, the third and fourth bonding insulating films 244 and 254 of every two adjacent second semiconductor chips of the chip stack 200 may include different materials. The third and fourth bonding insulating films 244 and 254 of every two adjacent second semiconductor chips of the chip stack 200 may include, for example, silicon oxide and/or silicon oxynitride.

The first molding layer 260 may be disposed on the first semiconductor chip 100. The first molding layer 260 may border or surround, for example, the entire side surfaces of the chip stack 200 when viewed in a plan view. The first molding layer 260 may extend along, for example, the entire upper surface of the first semiconductor chip 100 and the entire side surfaces of the chip stack 200. The first molding layer 260 may be in contact with, for example, the chip stack 200 and the first semiconductor chip 100. The first molding layer 260 may expose an upper surface 200*us* of the chip stack 200. The upper surface 200*us* of the chip stack 200 may be the upper surface of the second semiconductor chip 208 at the top of the chip stack 200.

The fifth bonding layer 300 may be disposed on the chip stack 200 and the first molding layer 260. The fifth bonding layer 300 may extend along, for example, the entire upper surface 200*us* of the chip stack 200 and the entire upper surface of the first molding layer 260. The fifth bonding layer 300 may be in contact with the upper surface 200*us* of the chip stack 200 and the upper surface of the first molding layer 260. The upper surface 200*us* of the chip stack 200 may be the lower surface of the fifth bonding layer 300.

The fifth bonding layer 300 may include, for example, one or more insulating materials, such as SiO, SiN, SiCN, SiOC, SiON, and/or SiOCN, but embodiments of the present disclosure are not limited thereto. The fifth bonding layer 300 may not include pads. The fifth bonding layer 300 may be a single film.

The fifth bonding layer 300 and the chip stack 200 may be bonded together. For example, the fifth bonding layer 300 may be directly bonded to the fourth bonding layer 250 of the second semiconductor chip 208. The fifth bonding layer 300 and the fourth bonding layer 250 of the second semiconductor chip 208 may be bonded by the dielectric-to-dielectric bonding method. The fifth bonding layer 300 and the fourth bonding layer 250 of the second semiconductor chip 208 may include the same material. In other embodiments, the fifth bonding layer 300 and the fourth bonding layer 250 of the second semiconductor chip 208 may include different materials. The fifth bonding layer 300 and the fourth bonding layer 250 of the second semiconductor chip 208 may include, for example, silicon oxide and/or silicon oxynitride.

The dummy semiconductor chip 400 may be disposed on the fifth bonding layer 300. For example, the width of the dummy semiconductor chip 400 may be substantially the same as the width of the chip stack 200 in the first direction DR1. For example, the width of the dummy semiconductor chip 400 may differ from the width of the chip stack 200 and may be less than the width of the first semiconductor chip 100.

The dummy semiconductor chip 400 may include a dummy semiconductor substrate 410 and a sixth bonding layer 440. The dummy semiconductor chip 400 may be a semiconductor substrate not including a circuit layer.

The first semiconductor substrate 110 of the first semiconductor chip 100, the second semiconductor substrates 210 of the second semiconductor chips 201 through 208, and the dummy semiconductor substrate 410 of the dummy semiconductor chip 400 may include, for example, bulk silicon (Si) or silicon-on-insulator (SOI). In other embodiments, the first semiconductor substrate 110 of the first semiconductor chip 100, the second semiconductor substrates 210 of the second semiconductor chips 201 through 208, and the dummy semiconductor substrate 410 of the dummy semiconductor chip 400 may be Si substrates or may include another material other than Si, such as, for example, silicon germanium (SiGe), SiGe-on-insulator (SGOI), indium antimonide, lead telluride, indium arsenide, indium phosphide, gallium arsenide, and/or gallium antimonide, but embodiments of the present disclosure are not limited thereto.

The sixth bonding layer 440 may be disposed on the dummy semiconductor substrate 410. The sixth bonding layer 440 may be disposed between the dummy semiconductor substrate 410 and the fifth bonding layer 300.

The sixth bonding layer 440 may include, for example, one or more insulating materials, such as SiO, SiN, SiCN, SiOC, SiON, and/or SiOCN, but embodiments of the present disclosure are not limited thereto. The sixth bonding layer 440 may not include pads. As the fourth bonding layer 250 of the second semiconductor chip 208, the fifth bonding layer 300, and the sixth bonding layer 440 of the dummy semiconductor chip 400 do not include pads, the fourth bonding layer 250 of the second semiconductor chip 208, the fifth bonding layer 300, and the sixth bonding layer 440 of the dummy semiconductor chip 400 may not be electrically connected to one another. That is, the dummy semiconductor chip 400 may not be electrically connected to the chip stack 200 and the first semiconductor chip 100.

The dummy semiconductor chip 400 may be bonded to the fifth bonding layer 300. The sixth bonding layer 440 of the dummy semiconductor chip 400 and the fifth bonding layer 300 may be in contact with each other. The sixth bonding layer 440 and the fifth bonding layer 300 may be directly bonded together. The sixth bonding layer 440 and the fifth bonding layer 300 may be directly bonded together by the dielectric-to-dielectric bonding method. The sixth bonding layer 440 and the fifth bonding layer 300 may include the same material. In other embodiments, the sixth bonding layer 440 and the fifth bonding layer 300 may include different materials. The sixth bonding layer 440 and the fifth bonding layer 300 may include, for example, silicon oxide and/or silicon oxynitride.

The second molding layer 460 may be disposed on the fifth bonding layer 300. The second molding layer 460 may border or surround at least part of the dummy semiconductor chip 400 in a plan view. The second molding layer 460 may border or surround the side surfaces of the dummy semiconductor chip 400 in a plan view. The side surfaces of the first semiconductor chip 100, the side surfaces of the first molding layer 260, the side surfaces of the fifth bonding layer 300, and the side surfaces of the second molding layer 460 may be disposed on the same planes. The fifth bonding layer 300 may be disposed between the first and second molding layers 260 and 460.

The second molding layer 460 may expose the upper surface of the dummy semiconductor chip 400.

The first and second molding layers 260 and 460 may include, for example, an insulating polymer material, such as an epoxy molding compound (EMC), but embodiments of the present disclosure are not limited thereto.

In some embodiments, the first semiconductor chip 100 and the second semiconductor chips 201 through 208 may be semiconductor memory chips. In some embodiments, the first semiconductor chip 100 may be a logic chip, and the second semiconductor chips 201 through 208 may be semiconductor memory chips. In some embodiments, the first semiconductor chip 100 and the chip stack 200 may be high-bandwidth memories (HBMs), in which case, the first semiconductor chip 100 may be a buffer chip and the second semiconductor chips 201 through 208 may be semiconductor memory chips. The first semiconductor chip 100 may function as a buffer die, and the second semiconductor chips 201 through 208 may function as core dies. For example, the buffer die may also be referred to as an interface die, a base die, a logic die, or a master die, and the core dies may also be referred to as memory dies or slave dies.

Here, the logic chip may be, for example, a central processing unit (CPU), a graphics processing unit (GPU), a field-programmable gate array (FPGA), a digital signal processor, a cryptographic processor, a microprocessor, a microcontroller, and/or an application processor such as an application-specific integrated circuit (ASIC), but embodiments of the present disclosure are not limited thereto. The memory semiconductor chips may be, for example, volatile semiconductor memory chips, such as DRAMs and/or SRAMs or nonvolatile semiconductor memory chips such as PRAMs, MRAMs, FeRAMs, and/or RRAMs.

Referring to FIGS. 1 through 3, as the second semiconductor chips 201 through 208 are stacked, warpage may occur in the chip stack 200. As a result, at least part of the chip stack 200 may have a wavy shape. The upper surface 200*us* of the chip stack 200 may not be flat but wavy. The warpage of the chip stack 200 may become more severe closer to the top of the chip stack 200. That is, the upper surface 200*us* of the chip stack 200 may be rugged or irregular, and ruggedness in the upper surfaces of the second semiconductor chips 201 through 208 may increase closer to the top of the chip stack 200. Due to the rugged or irregular upper surface 200*us* of the chip stack 200, there may be areas where the dummy semiconductor chip 400 is not bonded to the upper surface 200*us* of the chip stack 200, or voids may be generated between the dummy semiconductor chip 400 and the chip stack 200. In other words, the dummy semiconductor chip 400 may not be properly bonded to the chip stack 200.

The fifth bonding layer 300 may be formed along the upper surface 200*us* of the chip stack 200. The lower surface of the fifth bonding layer 300 may have a wavy shape. The upper surface 300*us* of the fifth bonding layer 300 may be generally flat. That is, a thickness t of the fifth bonding layer 300 may not be uniform on the chip stack 200. For example, the thickness t of the fifth bonding layer 300 may increase and then decrease repeatedly in the first direction DR1 on the chip stack 200. The thickness t of the fifth bonding layer 300 may be, for example, 100 Å to 10000 Å on the chip stack 200.

The dummy semiconductor chip 400 may be bonded to the upper surface 300*us* of the fifth bonding layer 300, which is generally flat. Accordingly, the generation of voids between the dummy semiconductor chip 400 and the chip stack 200 can be reduced or prevented, and the dummy semiconductor chip 400 can be properly bonded to the chip stack 200, even though the upper surface 200*us* of the chip stack 200 has a wavy shape.

Figure 4:
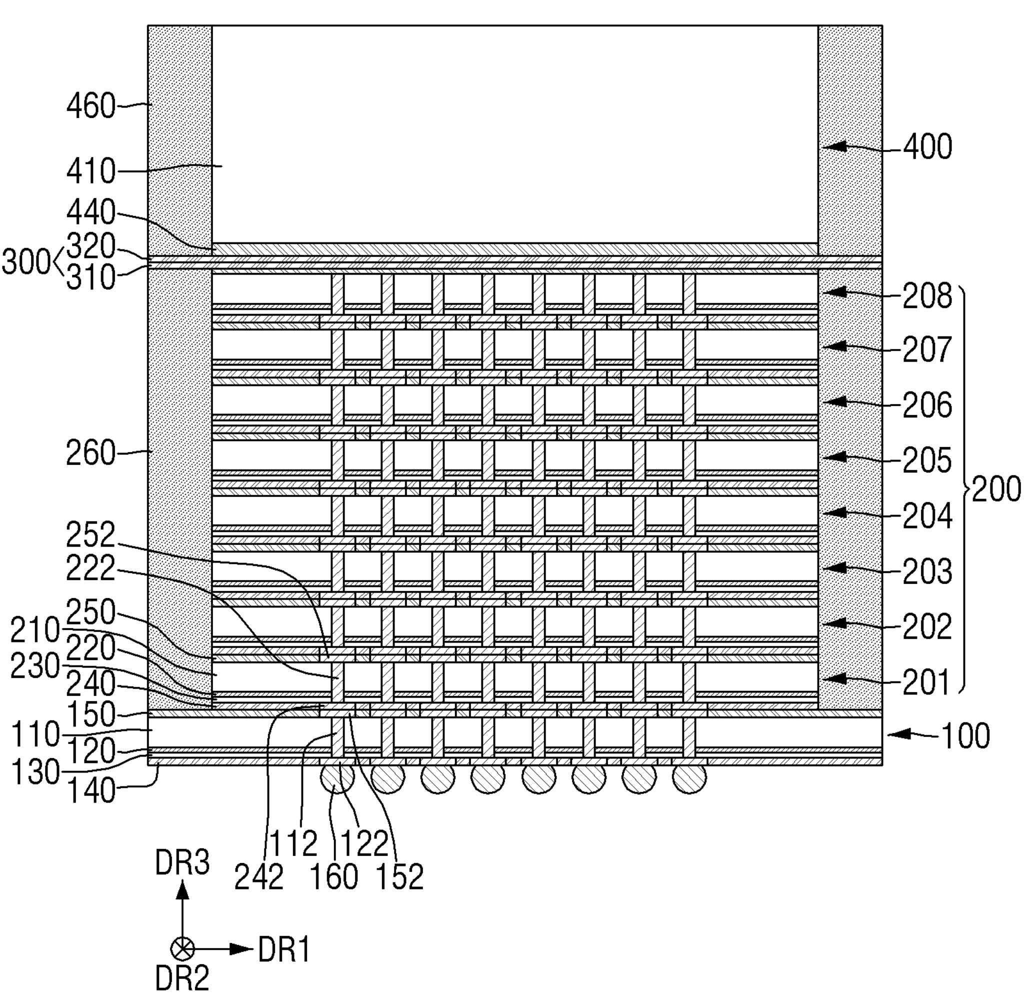
FIGS. 4 and 5 are cross-sectional views of semiconductor packages according to some embodiments of the present disclosure.
Figure 5:
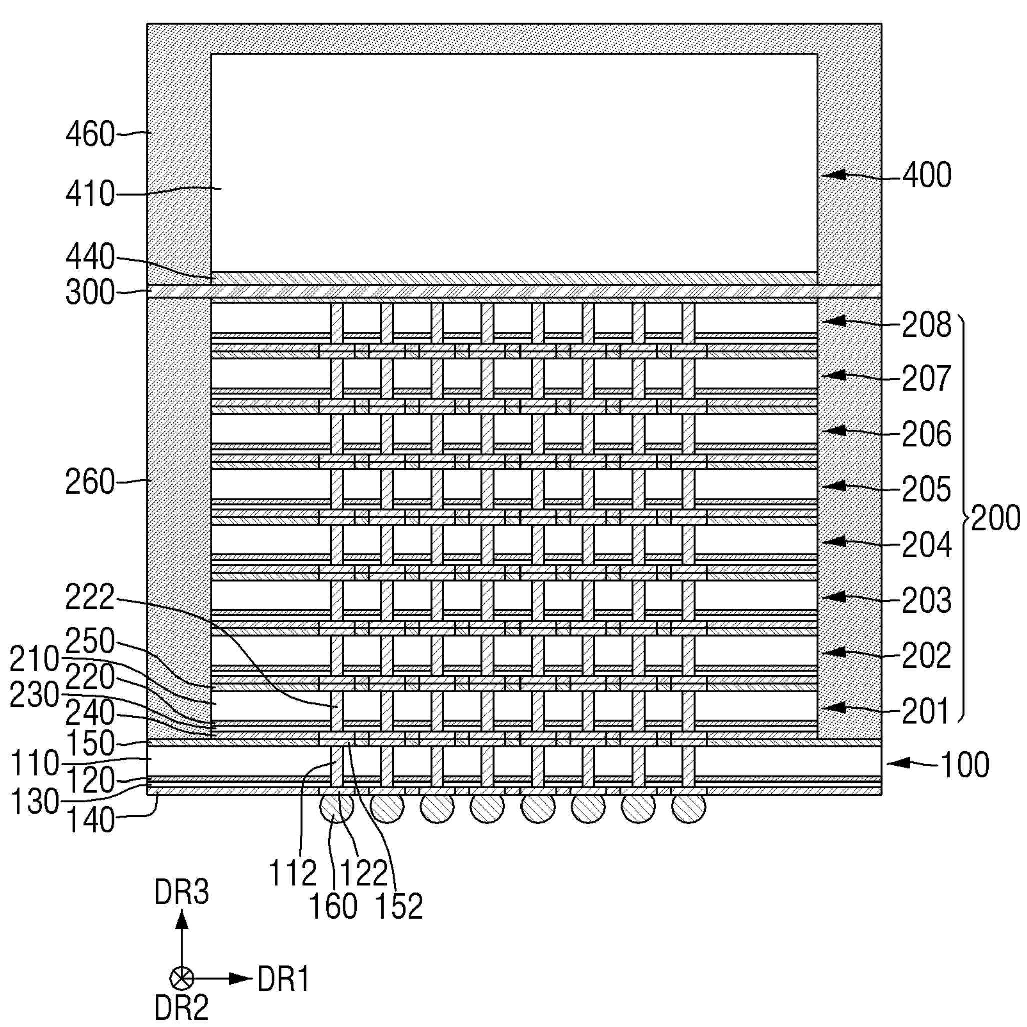

FIGS. 4 and 5 are cross-sectional views of semiconductor packages according to some embodiments of the present disclosure. For convenience, the embodiments of FIGS. 4 and 5 will hereinafter be described, focusing mainly on the differences with the embodiment of FIGS. 1 through 3.

Referring to FIG. 4, a fifth bonding layer 300 may include a plurality of layers.

For example, the fifth bonding layer 300 may include first and second layers 310 and 320, which are different. The second layer 320 may be stacked on the first layer 310. The first layer 310 may be in contact with a first molding layer 260 and a chip stack 200. The second layer 320 may be in contact with the first layer 310. A sixth bonding layer 440 of a dummy semiconductor chip 400 may be in contact with the third layer 320.

The first and second layers 310 and 320 may include an insulating material, such as, for example, SiO, SiN, SiCN, SiOC, SiON, and/or SiOCN, but embodiments of the present disclosure are not limited thereto. The first and second layers 310 and 320 may include the same material or different materials.

Referring to FIG. 5, a second molding layer 460 may be on and at least partially cover a dummy semiconductor chip 400. The second molding layer 460 may be on and at least partially cover the upper surface of the dummy semiconductor chip 400.

Figure 6:
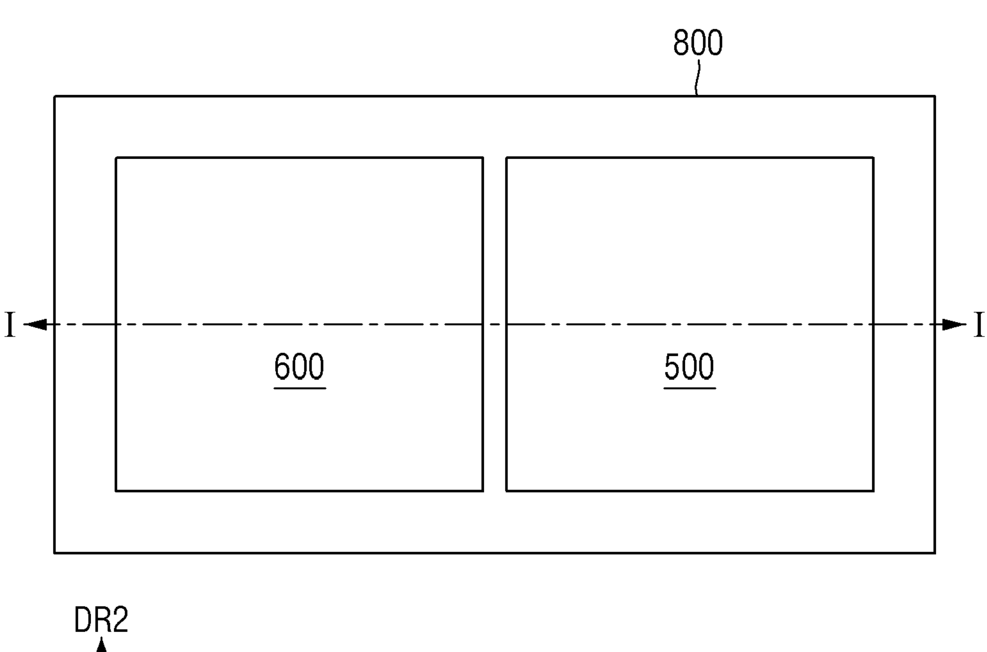
FIG. 6 is a plan view of a semiconductor package according to some embodiments of the present disclosure.
Figure 7:
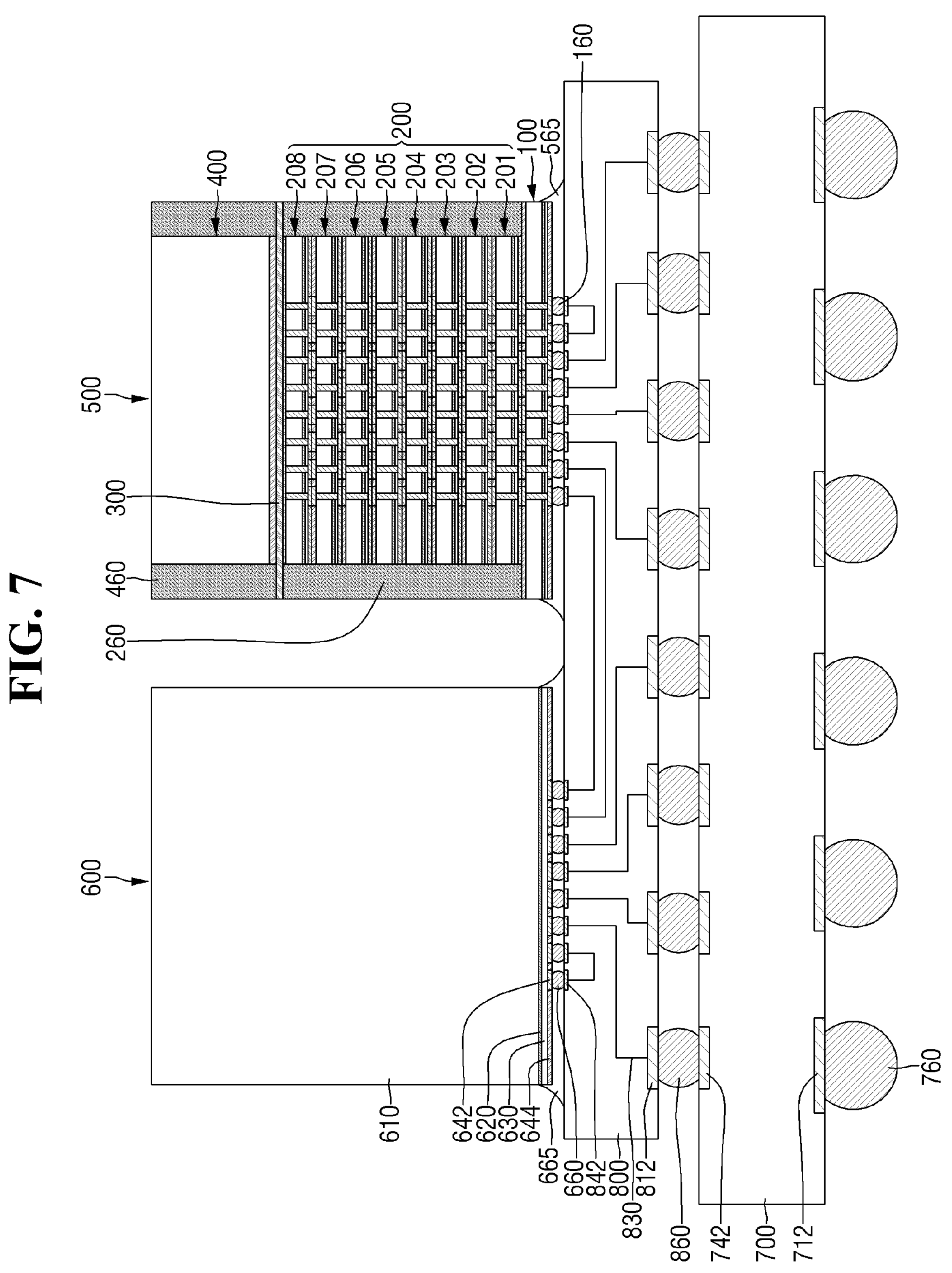
FIG. 7 is a cross-sectional view taken along line I-I of FIG. 6.

FIG. 6 is a plan view of a semiconductor package according to some embodiments of the present disclosure. FIG. 7 is a cross-sectional view taken along line I-I of FIG. 6. For convenience, the embodiment of FIGS. 6 and 7 will hereinafter be described, focusing mainly on the differences with the embodiments of FIGS. 1 through 5.

Referring to FIGS. 6 and 7, the semiconductor package may include a substrate 700, an interposer 800, a third semiconductor chip 600, and a semiconductor chip stack 500.

The substrate 700 may be a substrate for a semiconductor package. The substrate 700 may be, for example, a printed circuit board (PCB), a ceramic substrate, or a tape wiring substrate. The substrate 700 may include first substrate pads 712 and second substrate pads 742. The first substrate pads 712 may be disposed on the lower surface of the substrate 700, and the second substrate pads 742 may be disposed on the upper surface of the substrate 700. The first substrate pads 712 and the second substrate pads 742 may be electrically connected through wiring in the substrate 700.

Second connection terminals 760 may be disposed on the first substrate pads 712 of the substrate 700. The second connection terminals 760 may be electrically connected to the first substrate pads 712. The second connection terminals 760 may include, for example, solder balls, bumps, and UBM. First connection terminals 160 may include a metal such as Sn, but embodiments of the present disclosure are not limited thereto.

The interposer 800 may be disposed on the substrate 700. The interposer 800 may include first interposer pads 812, second interposer pads 842, and wiring patterns 830. The first interposer pads 812 may be disposed on the lower surface of the interposer 800, and the second interposer pads 842 may be disposed on the upper surface of the interposer 800. The first interposer pads 812 and the second interposer pads 842 may be electrically connected through wiring patterns 830 in the interposer 800.

Third connection terminals 860 may be disposed between the interposer 800 and the substrate 700. The third connection terminals 860 may be disposed on the first interposer pads 812 of the interposer 800 and the second substrate pads 742 of the substrate 700. The third connection terminals 860 may be electrically connected to the first interposer pads 812 of the interposer 800 and the second substrate pads 742 of the substrate 700. Accordingly, the interposer 800 may be electrically connected to the substrate 700. The third connection terminals 860 may include, for example, solder balls, bumps, and/or UBM. The third connection terminals 860 may include a metal, such as Sn, but embodiments of the present disclosure are not limited thereto.

The semiconductor chip stack 500 and the third semiconductor chip 600 may be disposed on the interposer 800. The semiconductor chip stack 500 and the third semiconductor chip 600 may be disposed on the upper surface of the interposer 800 to be spaced apart from each other. For example, the semiconductor chip stack 500 and the third semiconductor chip 600 may be spaced apart from each other in a first direction DR1.

The semiconductor chip stack 500 may correspond to any one of the semiconductor packages of FIGS. 1 through 5. The first connection terminals 160 may be disposed between the semiconductor chip stack 500 and the interposer 800. The first connection terminals 160 may be disposed on the first bonding pads 142 of the first semiconductor chip 100 and the second interposer pads 842 of the interposer 800. The first connection terminals 160 may be electrically connected to the first bonding pads 142 of the first semiconductor chip 100 and the second interposer pads 842 of the interposer 800. Accordingly, the semiconductor chip stack 500 may be electrically connected to the interposer 800.

A first underfill 565 may be disposed between the interposer 800 and the semiconductor chip stack 500. The first underfill 565 may at least partially fill the space between the interposer 800 and the semiconductor chip stack 500. The first underfill 565 may be on and at least partially cover the first connection terminals 160.

The third semiconductor chip 600 may include a third semiconductor substrate 610, a third semiconductor element layer 620, a third chip wiring layer 630, a passivation film 644, and chip pads 642. The third semiconductor chip 600 may be, for example, a logic semiconductor chip.

The third semiconductor substrate 610 may include, for example, bulk Si or SOI. In other embodiments, the third semiconductor substrate 610 may be a Si substrate or may include a material other than Si, such as, for example, SiGe, SGOI, indium antimonide, lead telluride, indium arsenide, indium phosphide, gallium arsenide, and/or gallium antimonide, but embodiments of the present disclosure are not limited thereto.

The third semiconductor element layer 620 may be disposed on the third semiconductor substrate 610. The third semiconductor element layer 620 may be disposed on the lower surface of the third semiconductor substrate 610. The third semiconductor element layer 620 may include various microelectronic elements.

The third chip wiring layer 630 may be disposed on the third semiconductor element layer 620. The third chip wiring layer 630 may be electrically connected to the third semiconductor element layer 620. The third chip wiring layer 630, like the first and second chip wiring layers 130 and 230, may include an inter-chip wiring insulating film and chip wiring structures in the inter-chip wiring insulating film. The third semiconductor element layer 620 may be in contact with the chip wiring structures of the third chip wiring layer 630.

The passivation film 644 may be disposed on the third chip wiring layer 630. At least parts of the chip pads 642 may be exposed by the passivation film 644. The lower surfaces of the chip pads 642 may be exposed by the passivation film 644. The chip pads 642 may be electrically connected to the third chip wiring layer 630. The chip pads 642 may be in contact with the chip wiring structures of the third chip wiring layer 630.

Fourth connection terminals 560 may be disposed between the third semiconductor chip 600 and the interposer 800. The fourth connection terminals 560 may be disposed on the chip pads 642 of the third semiconductor chip 600 and the second interposer pads 842 of the interposer 800. The fourth connection terminals 560 may be electrically connected to the chip pads 642 of the third semiconductor chip 600 and the second interposer pads 842 of the interposer 800. Accordingly, the third semiconductor chip 600 may be electrically connected to the interposer 800. The semiconductor chip stack 500 and the third semiconductor chip 600 may be electrically connected through the interposer 800. The fourth connection terminals 560 may include, for example, solder balls, bumps, or UBM. The fourth connection terminals 560 may include a metal, such as Sn, but embodiments of the present disclosure are not limited thereto.

A second underfill 665 may be disposed between the interposer 800 and the third semiconductor chip 600. The second underfill 665 may at least partially fill the space between the interposer 800 and the third semiconductor chip 600. The second underfill 665 may be on and at least partially cover the third connection terminals 860. The first and second underfills 565 and 665 may include, for example, an insulating polymer material, such as an EMC, but embodiments of the present disclosure are not limited thereto.

Figure 8:
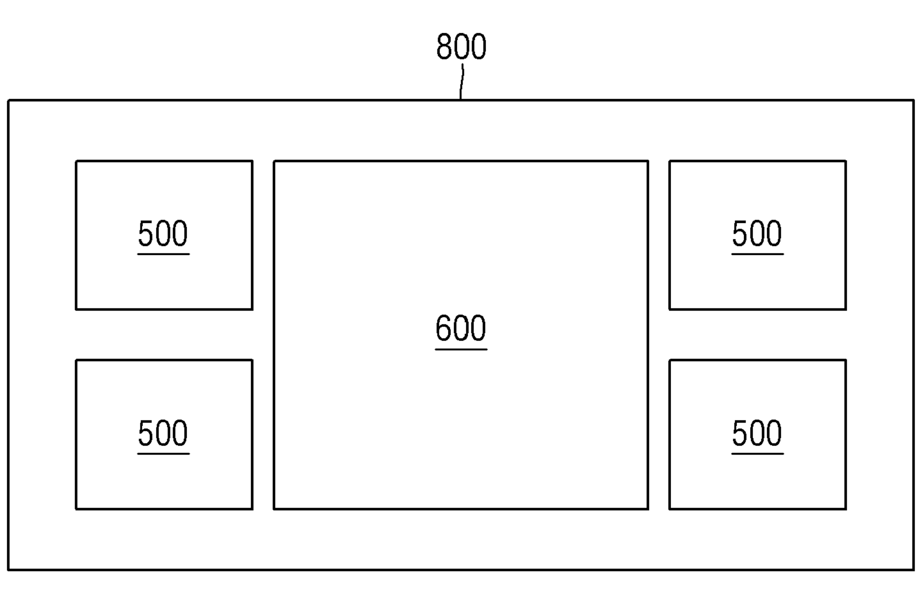
FIGS. 8 through 10 are plan views of semiconductor packages according to some embodiments of the present disclosure.
Figure 8:
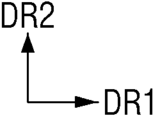
Figure 9:
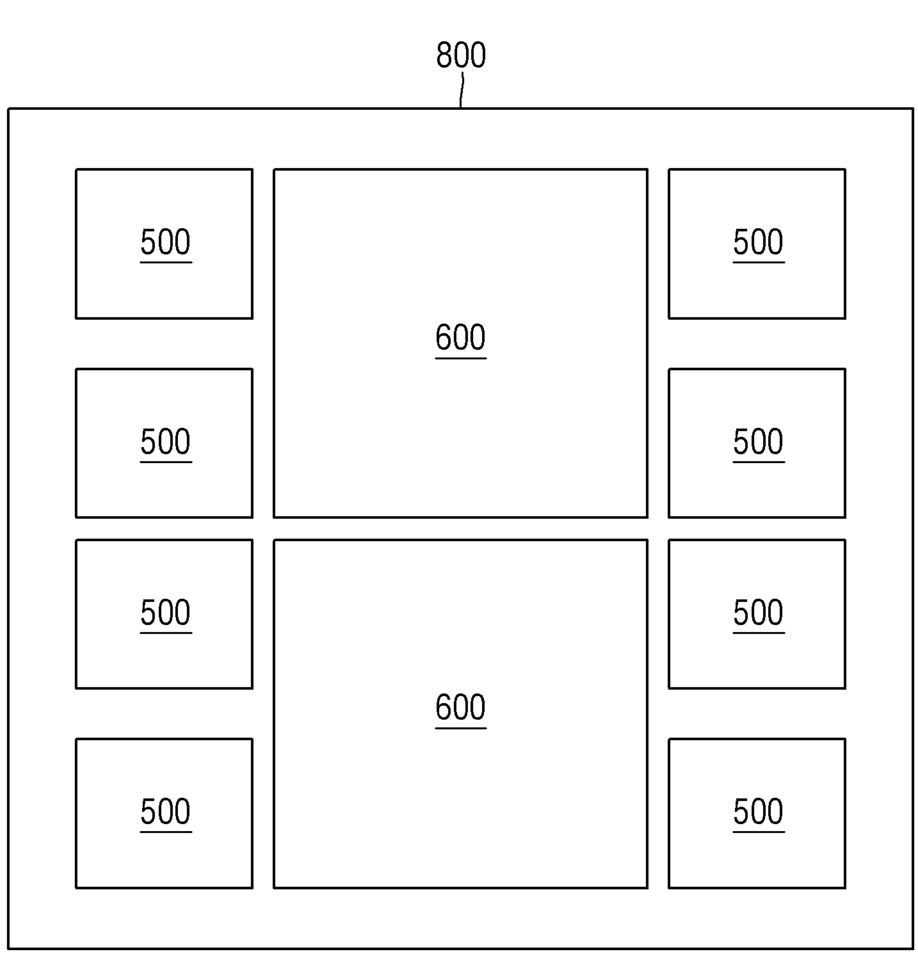
Figure 9:
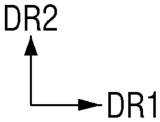
Figure 10:
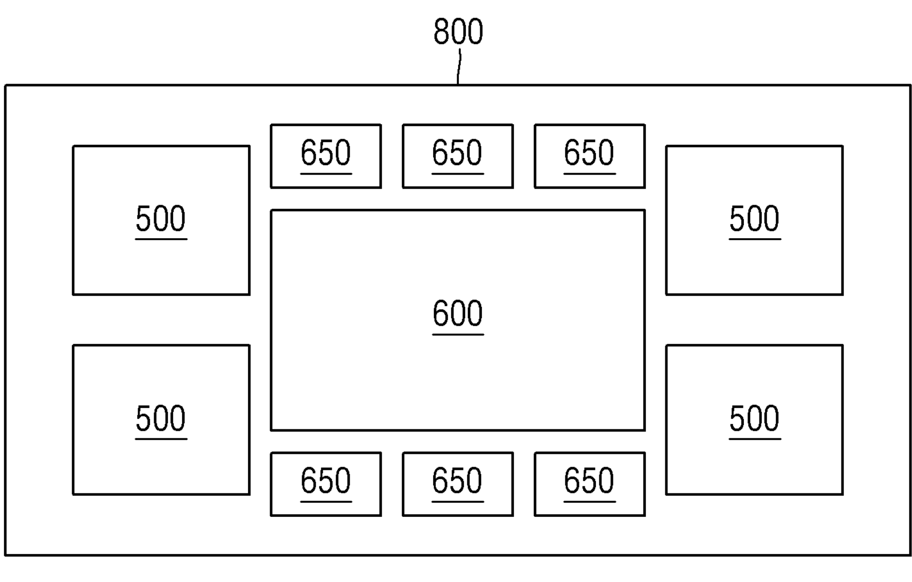
Figure 10:
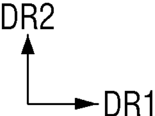

FIGS. 8 through 10 are plan views of semiconductor packages according to some embodiments of the present disclosure. For convenience, the embodiments of FIGS. 8 through 10 will hereinafter be described, focusing mainly on the differences with the embodiments of FIGS. 1 through 7.

Referring to FIG. 8, the semiconductor package may include a plurality of semiconductor chip stacks 500 and a third semiconductor chip 600. The semiconductor chip stacks 500 and the third semiconductor chip 600 may be disposed on an interposer 800. The semiconductor chip stacks 500 may be disposed around the third semiconductor chip 600 in a plan view.

For example, four semiconductor chip stacks 500 may be disposed around the third semiconductor chip 600 in a plan view. Two semiconductor chip stacks 500 may be disposed on each of both sides, in a first direction DR1, of the third semiconductor chip 600 to be spaced apart from each another in a second direction DR2. The third semiconductor chip 600 may be disposed between the semiconductor chip stacks 500.

Referring to FIG. 9, the semiconductor package may include a plurality of semiconductor chip stacks 500 and a plurality of third semiconductor chips 600. The semiconductor chip stacks 500 and the third semiconductor chips 600 may be disposed on an interposer 800.

For example, two first semiconductor chip stacks 500 may be disposed on each of both sides, in a first direction DR1, of each of the third semiconductor chips 600 to be spaced apart from each other in a second direction DR2. Four semiconductor chip stacks 500 may be disposed around each of the third semiconductor chips 600 in a plan view, similarly to what has been described above with reference to FIG. 8.

Referring to FIG. 10, the semiconductor package may include a plurality of semiconductor chip stacks 500, a third semiconductor chip 600, and a plurality of chiplets 650. The semiconductor chip stacks 500, the third semiconductor chip 600, and the chiplets 650 may be disposed on an interposer 800. The semiconductor chip stacks 500 and the chiplets 650 may be disposed around the third semiconductor chip 600 in a plan view. The chiplets 650 may include, for example, process chips, logic chips, and/or memory chips.

For example, six chiplets 650 may be disposed around the third semiconductor chip 600 in a plan view. Three chiplets 650 may be disposed on each of both sides, in a second direction DR2, of the third semiconductor chip 600 to be spaced apart from one another in a first direction DR1. The third semiconductor chip 600 may be disposed between the chiplets 650. Four semiconductor chip stacks 500 may be disposed around one third semiconductor chip 600 in a plan view, similar to what has been described above with reference to FIG. 8.

FIGS. 11 through 18 are cross-sectional views illustrating a method of fabricating a semiconductor package according to some embodiments of the present disclosure.

Figure 11:
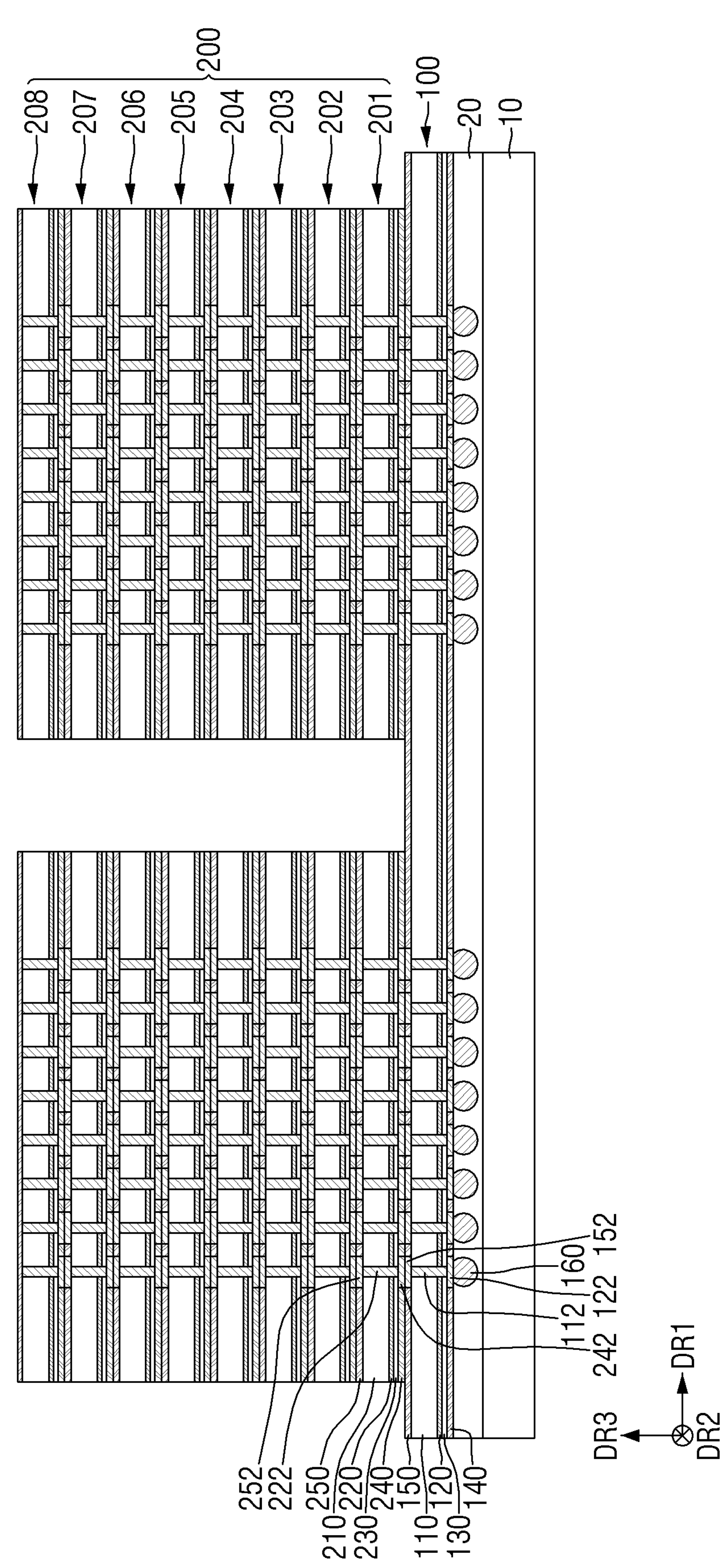

Referring to FIG. 11, a carrier substrate 10 with a first semiconductor chip 100 attached thereto may be provided.

For example, a first semiconductor element layer 120 may be formed on a first surface 110*a* of a first semiconductor substrate 110. First through vias 112 may be formed in the first semiconductor substrate 110 and the first semiconductor element layer 120. The first through vias 112 may not be exposed from a third surface of the first semiconductor substrate 110, which is opposite to the first surface 110*a* of the first semiconductor substrate 110. A first chip wiring layer 130 may be formed on the first semiconductor element layer 120. A first bonding layer 140 may be formed on the first chip wiring layer 130. First connection terminals 160 may be formed on first bonding pads 142 of the first bonding layer 140. The first semiconductor chip 100 may be attached onto a carrier substrate 10. The first semiconductor chip 100 may be attached onto the carrier substrate 10 via an adhesive layer 20. As an etching process is performed from the third surface of the first semiconductor substrate 110, a second surface 110*b* of the first semiconductor substrate 110 may be formed, and the first through vias 112 may be exposed. A second bonding layer 150 may be formed on the second surface 110*b* of the first semiconductor substrate 110. Second bonding pads 152 of the second bonding layer 150 may be formed on the first through vias 112.

Thereafter, chip stacks 200 may be bonded onto the first semiconductor chip 100. The chip stacks 200 may be mounted on the first semiconductor chip 100.

For example, each of the chip stacks 200 may include a plurality of second semiconductor chips 201 through 208, which are stacked. In each of the chip stacks 200, a pair of adjacent second semiconductor chips may be bonded together by a pair of adjacent third and fourth bonding layers 240 and 250, and the pair of adjacent third and fourth bonding layers 240 and 250 may be bonded together. In each of the second semiconductor chips 201 through 207, third bonding pads 242 of a third bonding layer 240 and fourth bonding pads 252 of a fourth bonding layer 250 may be bonded together, and in each of the second semiconductor chips 201 through 208, a third bonding insulating film 244 of the third bonding layer 240 and a fourth bonding insulating film 254 of the fourth bonding layer 250 may be bonded together. The fourth bonding layer 250 of the second semiconductor chip 208 of each of the chip stacks 200, which is at the top of the corresponding chip stack 200, may not include pads. The second semiconductor chips 201 through 208 may be bonded together by a hybrid bonding method. In each of the second semiconductor chips 201 through 208, the third and fourth bonding insulating films

244 and 254 may be bonded together by a dielectric-to-dielectric bonding method, and in each of the second semiconductor chips 201 through 207, the third bonding pads 242 and 252 may be bonded together by a metal-to-metal bonding method.

The first semiconductor chip 100 and each of the chip stacks 200 may be bonded together by a pair of adjacent second and third bonding layers 150 and 240. The third bonding layer 240 of the second semiconductor chip 201 of each of the chip stacks 200, which is at the bottom of the corresponding chip stack 200, and the second bonding layer 150 of the first semiconductor chip 100 may be bonded together. The third bonding pads 242 of the third bonding layer 240 of the second semiconductor chip 201 of each of the chip stacks 200 and the second bonding pads 152 of the second bonding layer 150 may be bonded together. The third bonding insulating film 244 of the third bonding layer 240 of the second semiconductor chip 201 of each of the chip stacks 200 and a second bonding insulating film 154 of the second bonding layer 150 may be bonded together. The first semiconductor chip 100 and the second chip stacks 200 may be bonded together by the hybrid bonding method. The third bonding insulating film 244 of the third bonding layer 240 of the second semiconductor chip 201 of each of the chip stacks 200 and the second bonding insulating film 154 of the second bonding layer 150 may be bonded together by the dielectric-to-dielectric bonding method, and the third bonding pads 242 of the third bonding layer 240 of the second semiconductor chip 201 of each of the chip stacks 200 and the second bonding pads 152 of the second bonding layer 150 may be bonded together by the metal-to-metal bonding method.

Figure 12:
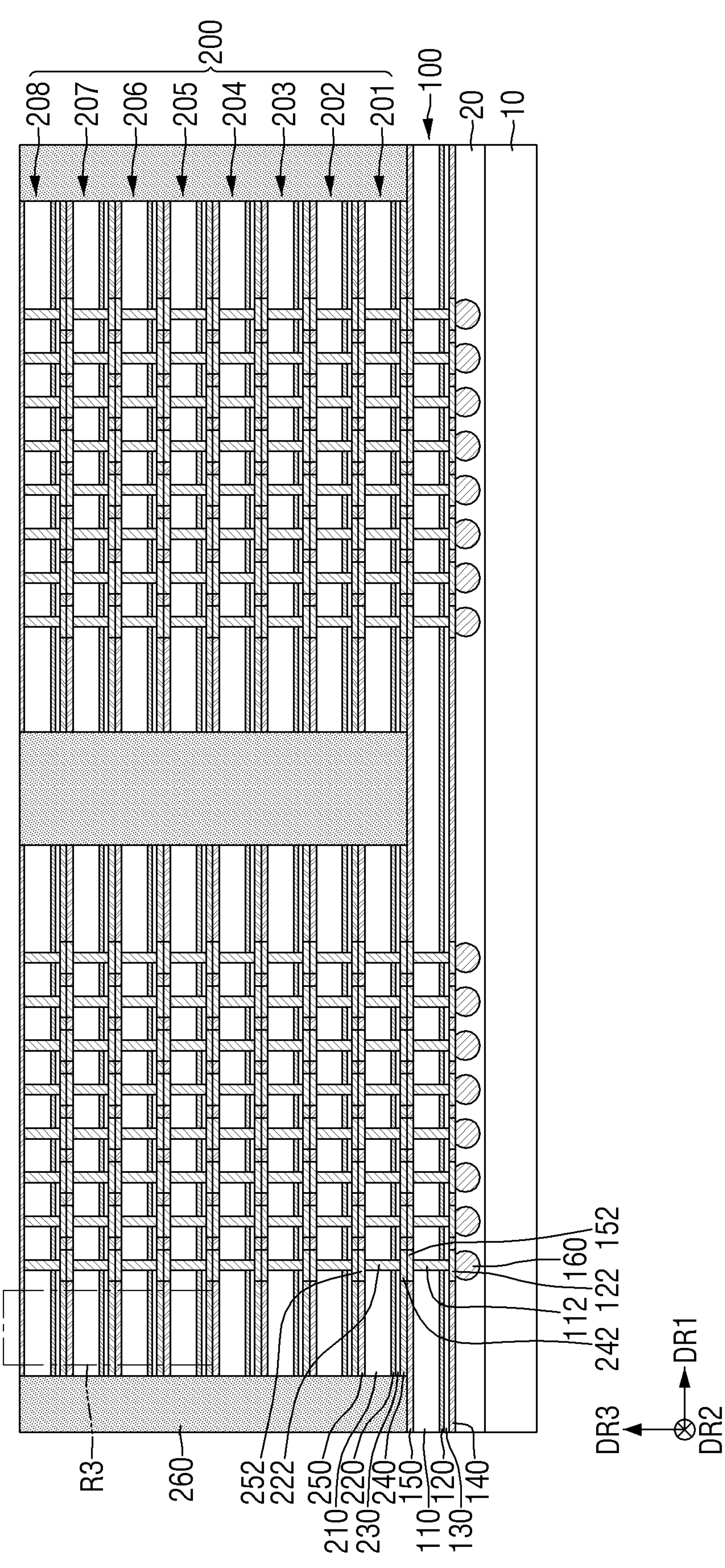

Referring to FIG. 12, a first molding layer 260 may be formed on the first semiconductor chip 100. The first molding layer 260 may at least partially fill the gap between a pair of adjacent chip stacks 200. The first molding layer 260 may border or surround the entire side surfaces of each of the chip stacks 200 in a plan view and may expose upper surfaces 200*us* of the chip stacks 200. For example, the first molding layer 260 may be on and at least partially cover the first semiconductor chip 100 and the chip stacks 200. A planarization process may be performed on the first molding layer 260, and as a result, the upper surfaces 200*us* of the chip stacks 200 may be exposed.

Figure 13:
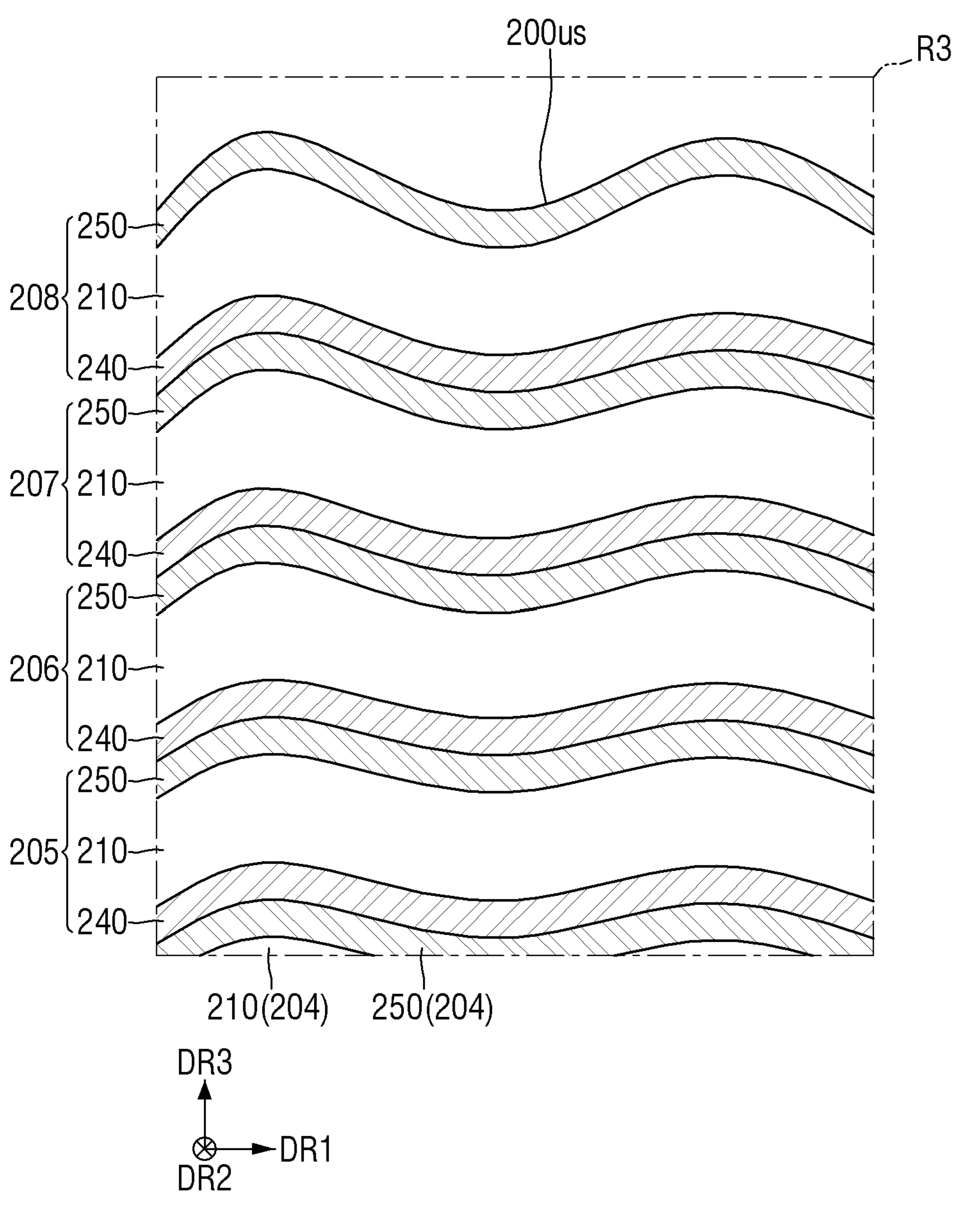

Referring to FIG. 13, the upper surfaces 200*us* of the chip stacks 200 may have a wavy shape. The upper surfaces 200*us* of the chip stacks 200 may be rugged or irregular.

Figure 14:
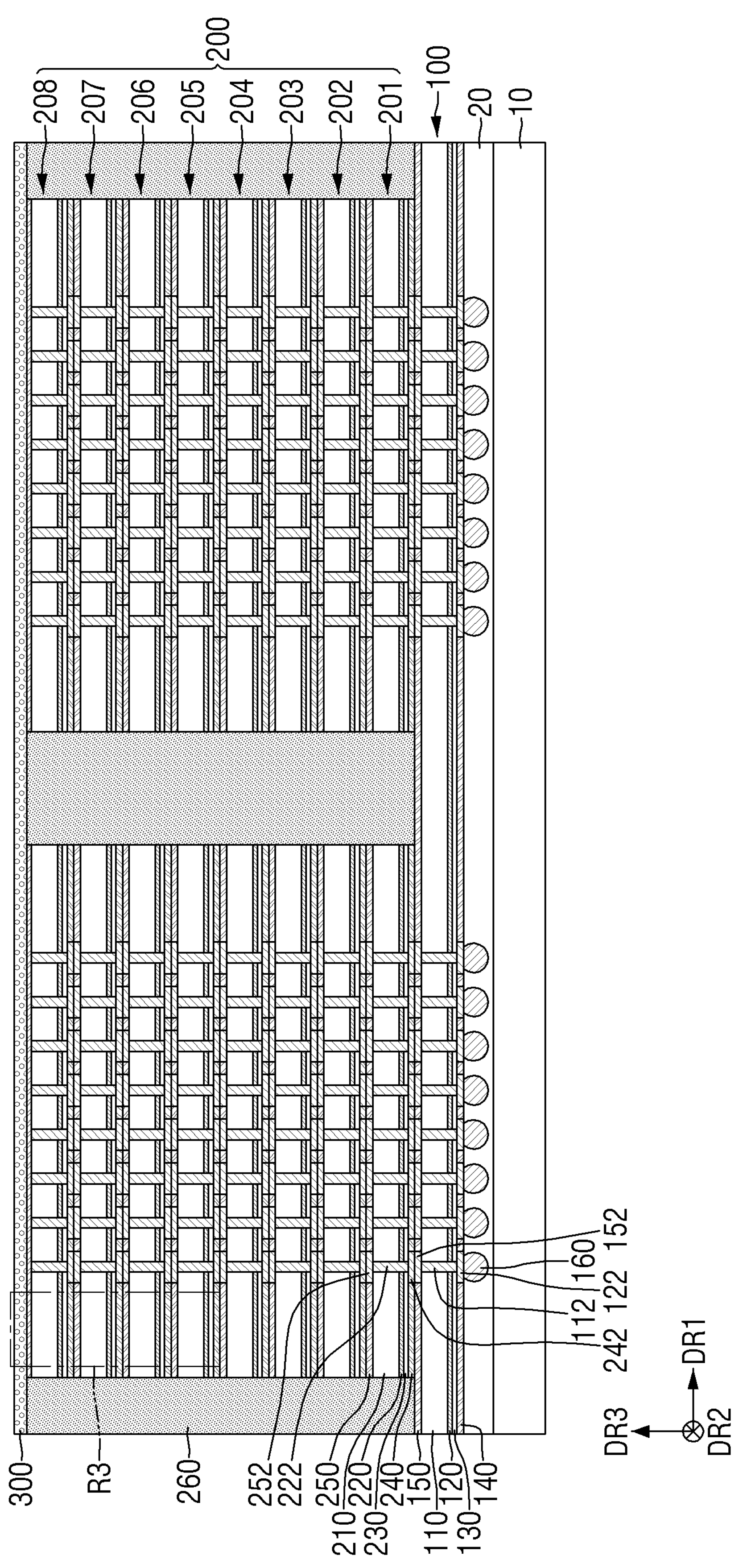

Referring to FIG. 14, a fifth bonding layer 300 may be formed on the first molding layer 260 and the chip stacks 200. The fifth bonding layer 300 may extend along the upper surface of the first molding layer 260 and the upper surfaces 200*us* of the chip stacks 200.

Figure 15:
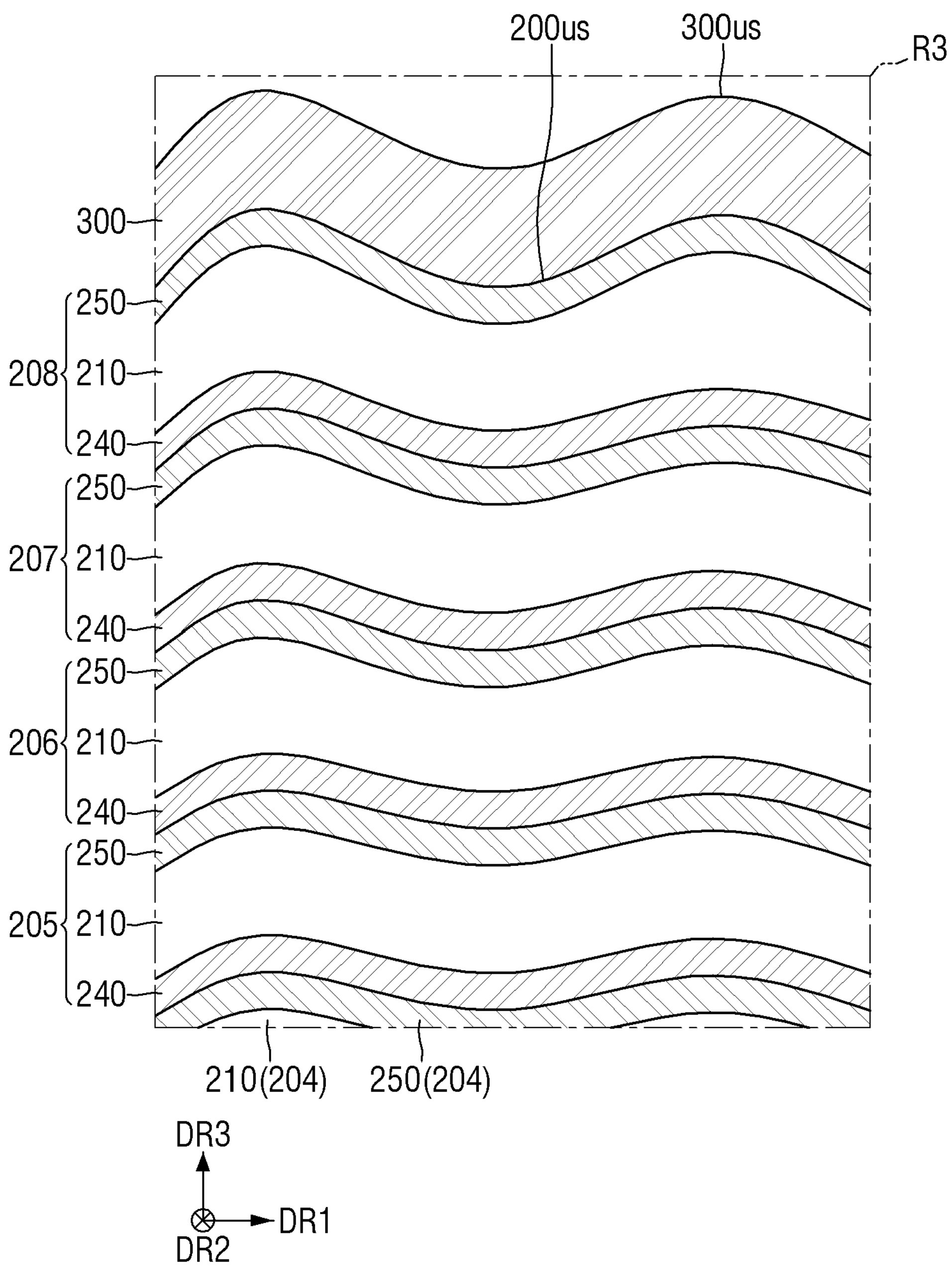

Referring to FIG. 15, the lower surface of the fifth bonding layer 300 may be in contact with the upper surfaces 200*us* of the chip stacks 200 and the upper surface of the first molding layer 260. The lower surface of the fifth bonding layer 300 may have a wavy shape. The lower surface of the fifth bonding layer 300 may be rugged or irregular. The lower surface of the fifth bonding layer 300 may be conformally formed along the upper surface of the first molding layer 260 and the upper surfaces 200*us* of the chip stacks 200. An upper surface 300*us* of the fifth bonding layer 300 may have a wavy shape. The upper surface 300*us* of the fifth bonding layer 300 may be rugged or irregular.

Figure 16:
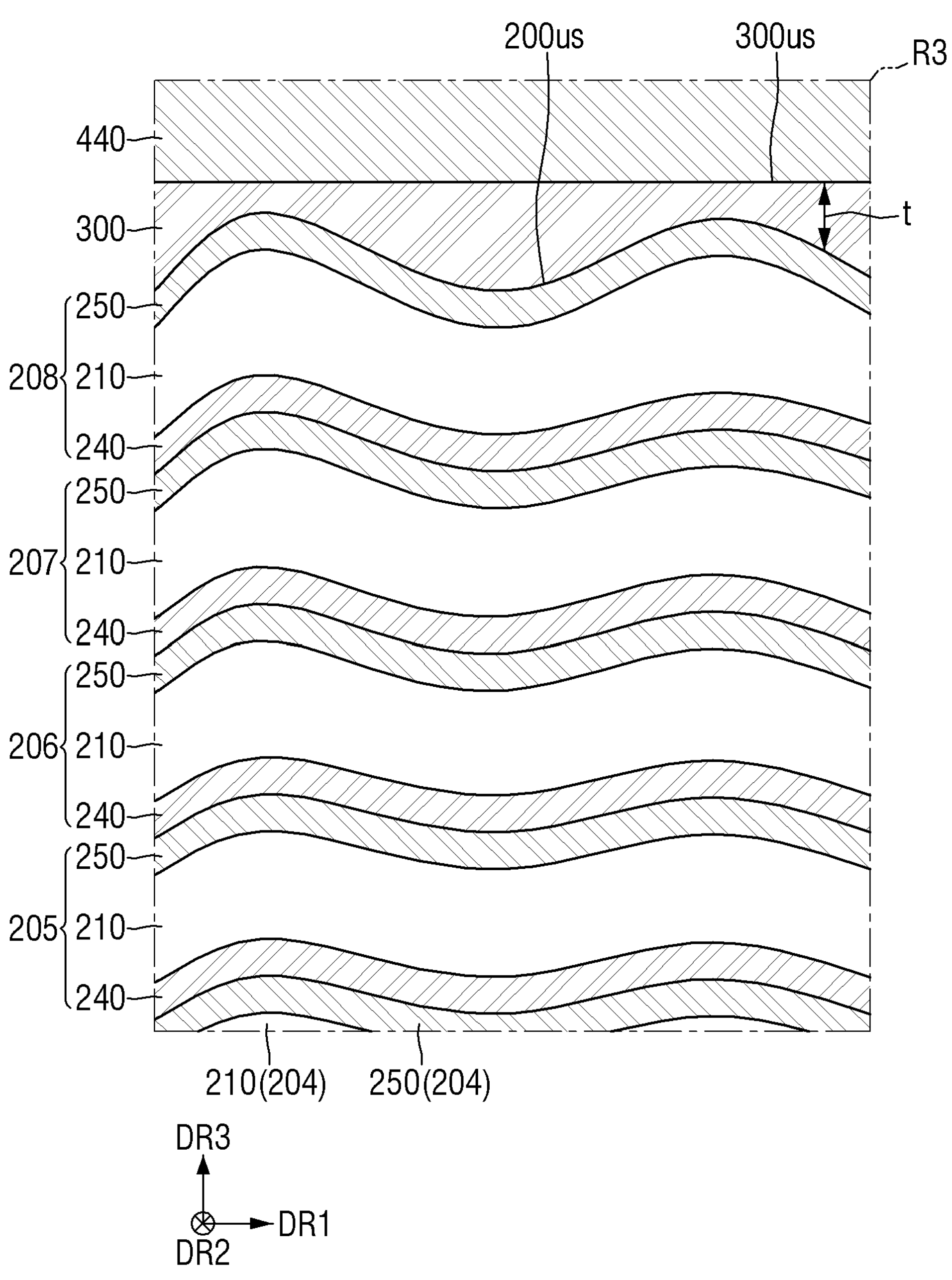

Referring to FIG. 16, a planarization process may be performed on the fifth bonding layer 300. As a result, the upper surface 300*us* of the fifth bonding layer 300 may become generally flat. A thickness t of the fifth bonding layer 300 on the chip stacks 200 may be, for example, 100 Å to 10000 Å.

Figure 17:
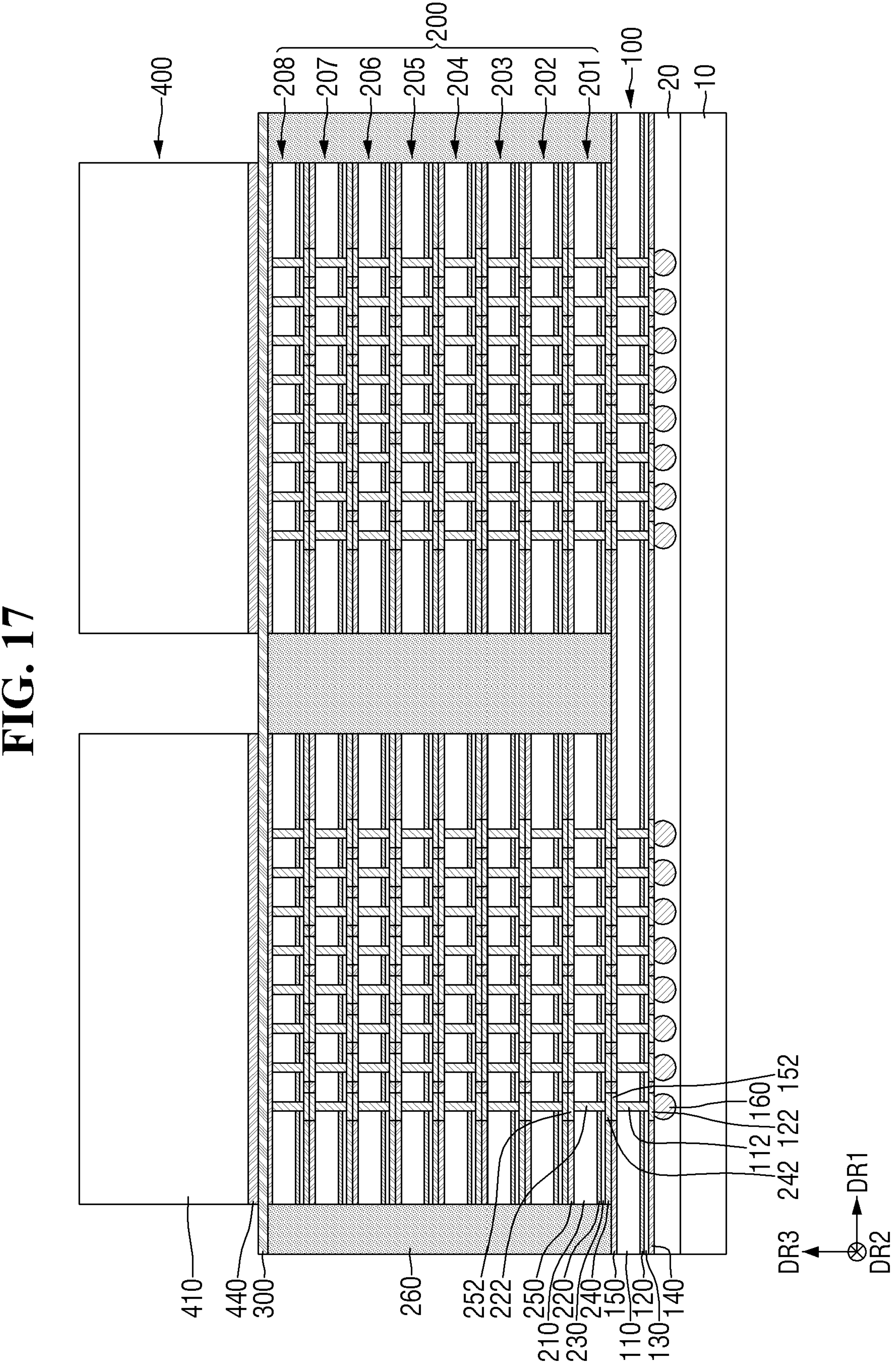

Referring to FIG. 17, dummy semiconductor chips 400 may be bonded to the fifth bonding layer 300.

For example, the dummy semiconductor chips 400, which includes dummy semiconductor substrates 410 and sixth bonding layers 420 formed on the dummy semiconductor substrates 410, may be provided. The sixth bonding layers 420 may not include pads. The sixth bonding layers 420 of the dummy semiconductor chips 400 may be bonded to the fifth bonding layer 300. The sixth bonding layers 420 of the dummy semiconductor chips 400 and the third bonding layers 240 of the second semiconductor chips 201 of the chip stacks 200 may be bonded together by the dielectric-to-dielectric bonding method.

Figure 18:
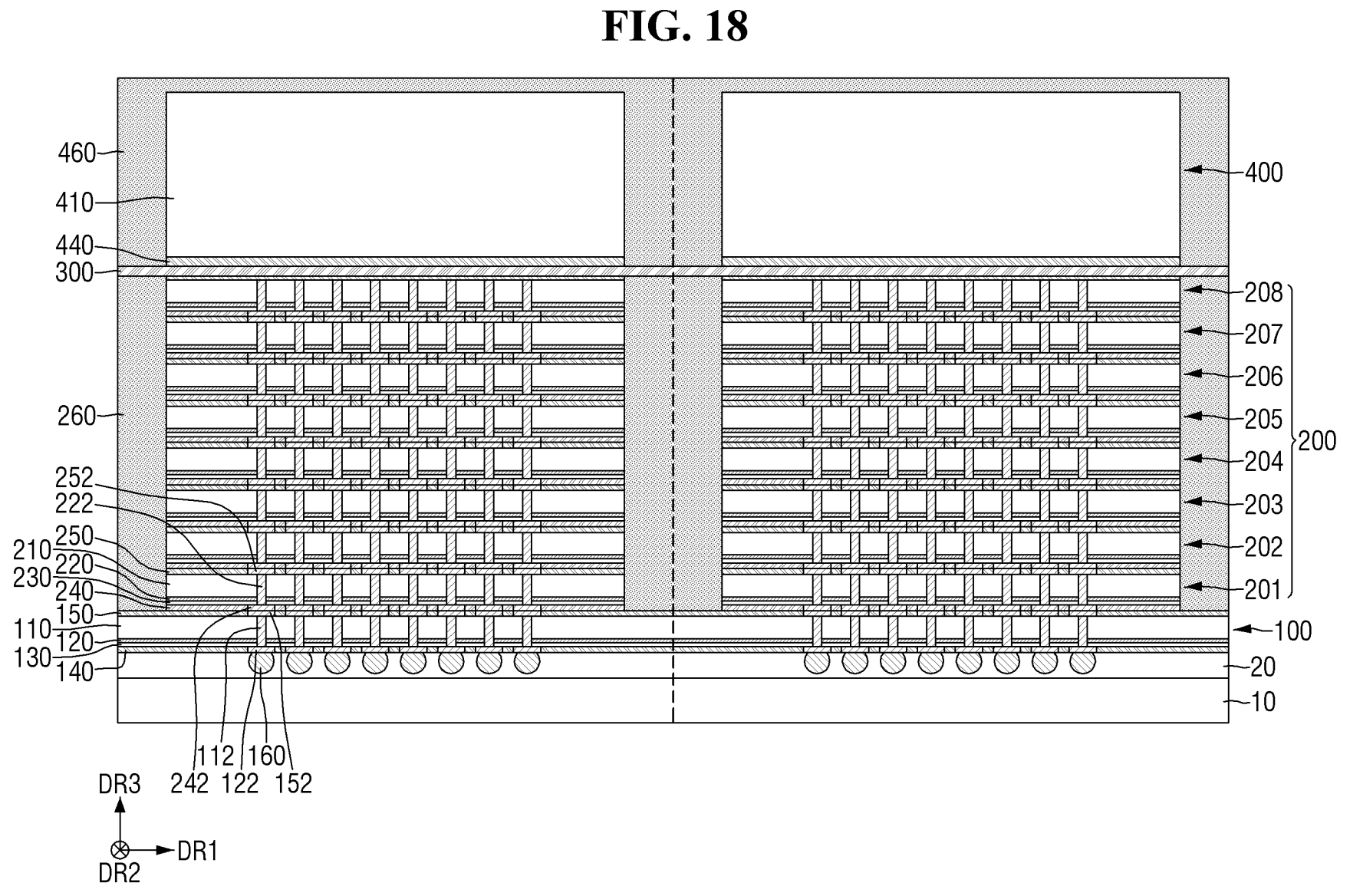

Referring to FIG. 18, a second molding layer 460 may be formed on the fifth bonding layer 300. The second molding layer 460 may be on and may cover at least parts of the dummy semiconductor chips 400. The second molding layer 460 may at least partially fill the gap between a pair of adjacent dummy semiconductor chips 400. For example, the second molding layer 460 may be formed to be on and at least partially cover the dummy semiconductor chips 400, and then, a planarization process may be performed. Accordingly, the second molding layer 460 may expose or at least partially cover the upper surfaces of the dummy semiconductor chips 400.

Thereafter, a sawing process may be performed, thereby obtaining multiple semiconductor packages, like the semiconductor packages of FIGS. 1 through 5. Accordingly, the side surfaces of the first semiconductor chip 100, the side surfaces of the first molding layer 260, the side surfaces of the fifth bonding layer 300, and the side surfaces of the second molding layer 460 may be disposed on the same planes.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. A semiconductor package comprising:

a first semiconductor chip including a first semiconductor substrate having first and second surfaces that are opposite to each other, a first bonding layer on the first surface of the first semiconductor substrate, a second bonding layer on the second surface of the first semiconductor substrate, and first through vias in the semiconductor substrate;

connection terminals on the first bonding layer;

a chip stack including a plurality of second semiconductor chips, on the first semiconductor chip, each of the second semiconductor chips including a second semiconductor substrate having third and fourth surfaces that are opposite to each other, where the third surface facing the second surface of the first semiconductor substrate, a third bonding layer on the third surface of the second semiconductor substrate, a fourth bonding layer on the fourth surface of the second semiconductor substrate, and second through vias in the second semiconductor substrate;

a first molding layer on the first semiconductor chip, the first molding layer surrounding the chip stack in a plan view and exposing an upper surface of the chip stack;

a fifth bonding layer on the first molding layer and on the upper surface of the chip stack, exposed by the first molding layer;

a dummy semiconductor chip on the fifth bonding layer, the dummy semiconductor chip including a dummy semiconductor substrate and a sixth bonding layer on the dummy semiconductor substrate; and a second molding layer on the fifth bonding layer, the second molding layer surrounding the dummy semiconductor chip in a plan view, wherein each pair of adjacent ones of the second and the third bonding layers are bonded together, each pair of adjacent ones of the third and the fourth bonding layers are bonded together, the fifth bonding layer is bonded to the one of the fourth bonding layers that is adjacent to the fifth bonding layer, the fifth and the sixth bonding layers are bonded together, a lower surface of the fifth bonding layer has a wavy shape, and an upper surface of the fifth bonding layer is flat.

2. The semiconductor package of claim 1, wherein side surfaces of the first semiconductor chip, side surfaces of the first molding layer, side surfaces of the fifth bonding layer, and side surfaces of the second molding layer are on a same plane.

3. The semiconductor package of claim 1, wherein the fifth and the sixth bonding layers include an insulating material and do not include pads.

4. The semiconductor package of claim 3, wherein the fifth and the sixth bonding layers include a same material.

5. The semiconductor package of claim 3, wherein the fifth and the sixth bonding layers include different materials.

6. The semiconductor package of claim 1, wherein a thickness of the fifth bonding layer on the chip stack is between 100 Å and 10000 Å.

7. The semiconductor package of claim 1, wherein each of the third bonding layers of the second semiconductor chips includes a first bonding insulating film and first bonding pads, which are in the first bonding insulating film and electrically connected to the second through vias, each of the fourth bonding layers of all the second semiconductor chips includes a second bonding insulating film, each of the fourth bonding layers of all the second semiconductor chips except for the second semiconductor chip at a top of the chip stack includes second bonding pads, which are in the second bonding insulating film and electrically connected to the second through vias, each pair of adjacent ones of the first and the second bonding insulating films are bonded together, and each pair of adjacent ones of the first and the second bonding pads are bonded together.

8. The semiconductor package of claim 7, wherein the first and the second bonding insulating films of each of the second semiconductor chips include the same material.

9. The semiconductor package of claim 7, wherein the first and the second bonding insulating films of each of the second semiconductor chips include different materials.

10. The semiconductor package of claim 1, wherein the second bonding layer of the first semiconductor chip includes a first bonding insulating film and first bonding pads, which are electrically connected to the first through vias, each of the third bonding layers of the second semiconductor chips includes a second bonding insulating film and second bonding pads in the second bonding insulating film, which are in the first bonding insulating film and electrically connected to the second through vias, each pair of adjacent ones of the first and the second bonding insulating films are bonded together, and each pair of adjacent ones of the first and the second bonding pads are bonded together.

11. A semiconductor package comprising:

a first semiconductor chip including a first bonding layer;

a chip stack electrically connected to the first semiconductor chip and including a plurality of second semiconductor chips, which are stacked, on the first semiconductor chip, each of the second semiconductor chips including second and third bonding layers, which are opposite to each other;

a first molding layer surrounding entire side surfaces of the chip stack in a plan view, on the first semiconductor chip;

a fourth bonding layer extending along an upper surface of the first molding layer and an upper surface of the chip stack;

a dummy semiconductor chip including a fifth bonding layer, on the fourth bonding layer, and not electrically connected to the chip stack; and a second molding layer surrounding at least part of the dummy semiconductor chip in a plan view, on the fourth bonding layer, wherein the first bonding layer and one of the second bonding layers that is adjacent to the first bonding layer are bonded together, each pair of adjacent ones of the second and the third bonding layers are bonded together, and the fifth bonding layer and one of the third bonding layers that is adjacent to the fifth bonding layer are bonded together, and the fourth and the fifth bonding layer are bonded together.

12. The semiconductor package of claim 11, wherein the upper surface of the chip stack has a wavy shape, and an upper surface of the fourth bonding layer is flat.

13. The semiconductor package of claim 11, wherein the first bonding layer includes a first bonding insulating film and first bonding pads, each of the second bonding layers of the second semiconductor chips includes a second bonding insulating film and second bonding pads, each of the third bonding layers of all the second semiconductor chips except for the second semiconductor chip at a top of the chip stack includes a third bonding insulating film and third bonding pads, the first bonding insulating film and one of the second bonding insulating films that is adjacent to the first bonding insulating film are bonded together, each pair of adjacent ones of the first and the second bonding pads are bonded together, each pair of adjacent ones of the second and the third bonding insulating films are bonded together, each pair of adjacent ones of the second and the third bonding pads are bonded together, and the third bonding layer of the second semiconductor chip at a top of the chip stack and the fourth and the fifth bonding layers include an insulating material and do not include pads.

14. The semiconductor package of claim 11, further comprising:

an interposer; and a third semiconductor chip on the interposer, wherein the first semiconductor chip is electrically connected to the third semiconductor chip through the interposer.

15. The semiconductor package of claim 11, wherein side surfaces of the first molding layer and side surfaces of the fourth bonding layer are on a same plane.

16. The semiconductor package of claim 11, wherein the fourth bonding layer includes silicon oxide and/or silicon oxynitride.

17. A semiconductor package comprising:

a first semiconductor chip;

a chip stack including a plurality of second semiconductor chips, which are stacked on the first semiconductor chip;

a first molding layer in contact with an upper surface of the first semiconductor chip and side surfaces of the chip stack and exposing an upper surface of the chip stack;

a bonding layer in contact with an upper surface of the first molding layer and the upper surface of the chip stack;

a dummy semiconductor chip on the bonding layer; and a second molding layer on at least part of the dummy semiconductor chip and on the bonding layer, wherein the upper surface of the chip stack has a wavy shape, and an upper surface of the bonding layer is flat.

18. The semiconductor package of claim 17, wherein the first semiconductor chip and the chip stack are bonded together by a metal-to-dielectric bonding method, the second semiconductor chips are bonded together by the metal-to-dielectric bonding method, the chip stack and the bonding layer are bonded together by a dielectric-to-dielectric bonding method, and the bonding layer and the dummy semiconductor chip are bonded together by the dielectric-to-dielectric bonding method.

19. The semiconductor package of claim 17, wherein a width of the dummy semiconductor chip is a same as a width of the chip stack in a cross-sectional view.

20. The semiconductor package of claim 17, wherein the bonding layer includes first and second layers, which are different from each other.

* * * * *